(12) United States Patent
Liao et al.

(10) Patent No.: US 10,914,895 B2
(45) Date of Patent: Feb. 9, 2021

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Yu-Kuang Liao, Hsinchu (TW); Cheng-Chun Tsai, Hsinchu (TW); Chen-Hua Yu, Hsinchu (TW); Fang-Cheng Chen, Hsin-chu (TW); Wen-Chih Chiou, Miaoli County (TW); Ping-Jung Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

(21) Appl. No.: 16/133,710

(22) Filed: Sep. 18, 2018

(65) Prior Publication Data

US 2020/0091124 A1   Mar. 19, 2020

(51) Int. Cl.
| | | |
|---|---|---|
| *G02B 6/125* | (2006.01) | |
| *G02B 6/42* | (2006.01) | |
| *G02B 6/122* | (2006.01) | |
| *G02B 6/43* | (2006.01) | |
| *H01L 23/522* | (2006.01) | |

(52) U.S. Cl.
CPC .......... *G02B 6/125* (2013.01); *G02B 6/122* (2013.01); *G02B 6/4201* (2013.01); *G02B 6/4274* (2013.01); *G02B 6/43* (2013.01); *H01L 23/5226* (2013.01)

(58) Field of Classification Search
None
See application file for complete search history.

(56) References Cited

U.S. PATENT DOCUMENTS

| | | | |
|---|---|---|---|
| 8,885,994 B2 * | 11/2014 | Beals | G02B 6/1221 385/132 |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |

(Continued)

OTHER PUBLICATIONS

Herb Schwetman et al. "An Energy-Efficient Optical Interconnect Architecture for Bandwidth-Balanced Systems," Journal of Lightwave Technology, vol. 34, No. 12, Jun. 15, 2016, pp. 2905-2919.

(Continued)

*Primary Examiner* — Michelle R Connelly
(74) *Attorney, Agent, or Firm* — JCIPRNET

(57) ABSTRACT

A package structure including a plurality of first dies and an insulating encapsulant is provided. The plurality of first dies each include a first waveguide layer having a first waveguide path of a bent pattern, wherein the first waveguide layers of the plurality of first dies are optically coupled to each other to form an optical route. The insulating encapsulant encapsulates the plurality of first dies.

20 Claims, 31 Drawing Sheets

(56) References Cited

U.S. PATENT DOCUMENTS

| | | | |
|---|---|---|---|
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2002/0039464 A1* | 4/2002 | Yoshimura | G02B 6/13 385/14 |
| 2005/0191004 A1* | 9/2005 | Hosino | H04Q 11/0005 385/14 |
| 2009/0245724 A1* | 10/2009 | Koizumi | H01L 24/96 385/14 |
| 2010/0266295 A1* | 10/2010 | Zheng | H04J 14/0227 398/201 |

OTHER PUBLICATIONS

M. Notomi et al. "Waveguides, resonators and their coupled elements in photonic crystal slabs," Optics Express, vol. 12, No. 8, Apr. 19, 2004, pp. 1551-1561.

Kazuhiko Ogusu et al. "Modeling of the dynamic transmission properties of chalcogenide ring resonators in the presence of fast and slow nonlinearities," Optics Express, vol. 19, No. 2, Jan. 17, 2011, pp. 649-659.

Tu Zhijuan et al. "Reliability characterization of silicon-based germanium waveguide photodetectors," Optical Engineering, vol. 53 No. 5, May 5, 2014, pp. 1-5.

\* cited by examiner

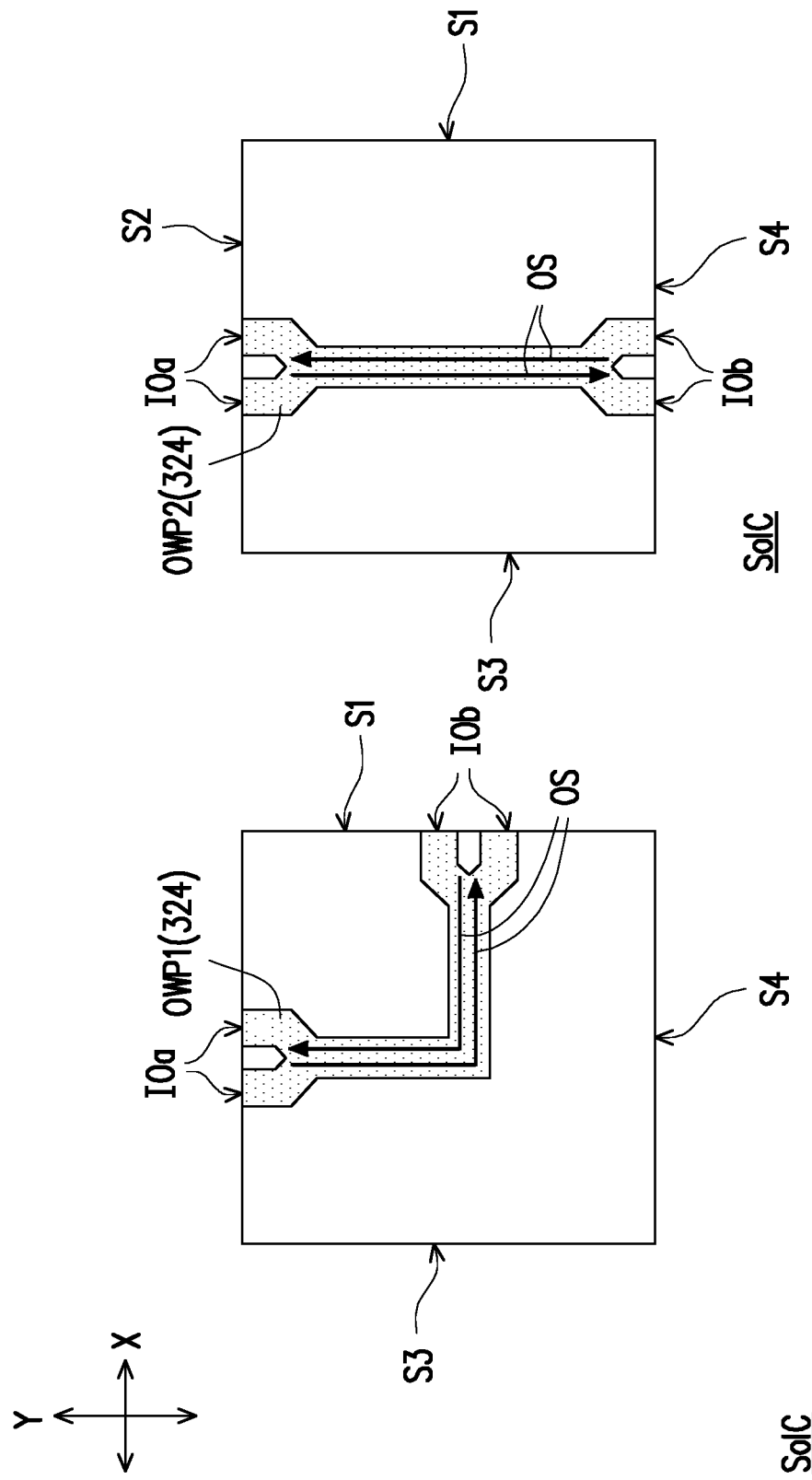

PACKAGE STRUCTURE AND MANUFACTURING METHOD THEREOF

BACKGROUND

Optical modules (involving optical signals) are used in high-speed optical communication systems that require high performance, compact package, and low power consumption. The optical modules comply with various international standard specifications at communication speeds ranging up to more than 100 Gbps. Currently, fabrication process of the optical modules in a semiconductor package is quite complex and demands high cost.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A to FIG. 9D are schematic plane views illustrating an optical waveguide path of a system-on-integrated circuit included in a package structure in accordance with some embodiments of the disclosure.

DETAILED DESCRIPTION

Figure 1:
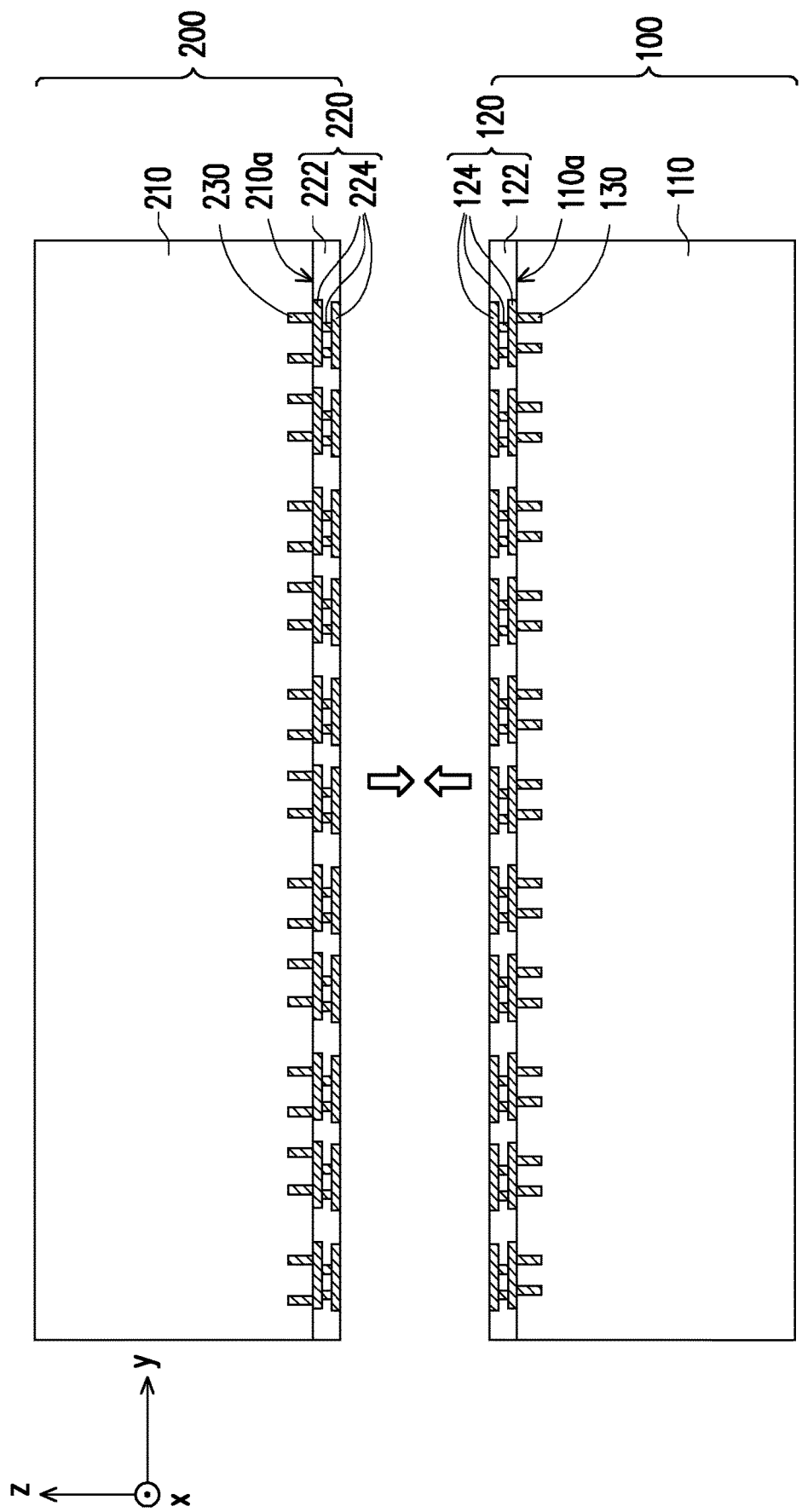
FIG. 1 to FIG. 8 and FIG. 10 to FIG. 17 are schematic cross sectional views of various stages in a manufacturing method of a package structure in accordance with some embodiments of the disclosure.

The following disclosure provides many different embodiments, or examples, for implementing different features of the provided subject matter. Specific examples of components and arrangements are described below to simplify the disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 23:
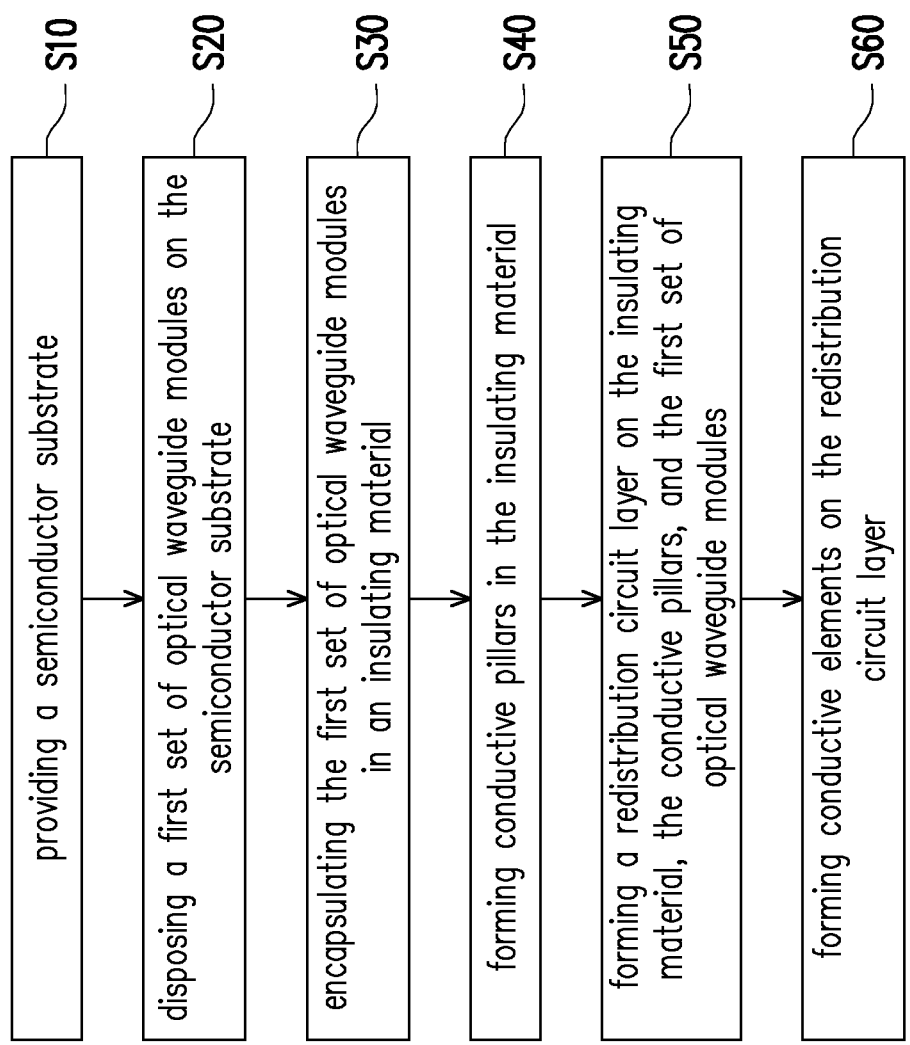
FIG. 23 and FIG. 24 are flow charts illustrating a method of manufacturing a package structure in accordance with some embodiments of the disclosure.
Figure 24:
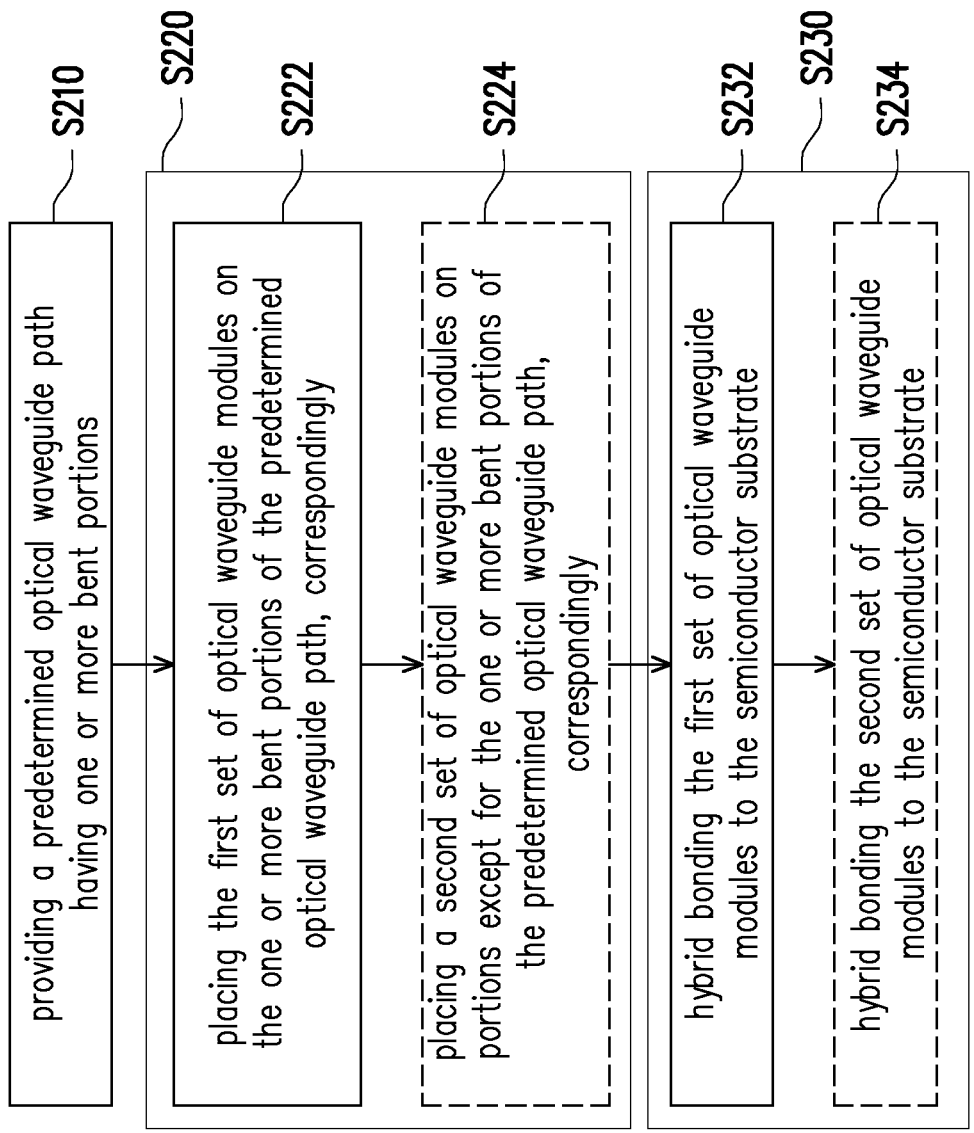

FIG. 1 to FIG. 8 and FIG. 10 to FIG. 17 are schematic cross sectional views of various stages in a manufacturing method of a package structure in accordance with some embodiments of the disclosure. FIG. 9A to FIG. 9D are schematic plane views illustrating an optical waveguide path of a system-on-integrated circuit included in a package structure in accordance with some embodiments of the disclosure. FIG. 18 is a top view of relative positions of system-on-integrated circuits and semiconductor devices included in a package structure in accordance with some embodiments of the disclosure. FIG. 23 and FIG. 24 are flow charts illustrating a method of manufacturing a package structure in accordance with some embodiments of the disclosure.

The embodiments are intended to provide further explanations but are not used to limit the scope of the disclosure. In some embodiments, the manufacturing method is part of a packaging process at a semiconductor wafer level. For illustrative purposes, in FIG. 1 to FIG. 8, six system-on-integrated-circuits SoIC are shown to represent plural system-on-integrated-circuits of a semiconductor wafer, and in FIG. 10 to FIG. 17, a package structure P1 including five system-on-integrated-circuits SoIC is shown to represent a package structure obtained following the manufacturing method, for example. In other embodiments, one or more system-on-integrated-circuits SoIC are shown to represent plural system-on-integrated-circuits of the semiconductor wafer or included in the (semiconductor) package structure, and one or more package structures P1 are shown to represent plural (semiconductor) package structures obtained following the (semiconductor) manufacturing method, the disclosure is not limited thereto.

Referring to FIG. 1, in some embodiments, a semiconductor wafer 100 and a semiconductor wafer 200 are provided. In some embodiments, the semiconductor wafer 100 and the semiconductor wafer 200 may be made of silicon or other semiconductor materials (e.g. an elementary semiconductor material such as germanium; a compound semiconductor such as silicon carbide, gallium arsenic, indium arsenide or indium phosphide; an alloy semiconductor such as silicon germanium, silicon germanium carbide, gallium arsenic phosphide, or gallium indium phosphide; or the like).

In certain embodiments, the semiconductor wafer 100 includes a semiconductor substrate 110 having an active surface 110a, an interconnection structure 120 disposed on the active surface 110a, and through silicon vias (TSVs) 130 embedded in the semiconductor substrate 110 and electrically connected to the interconnection structure 120.

In one embodiment, the material of the semiconductor substrate 110 may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 110 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In one embodiment, the interconnection structure 120 is formed on the active surface 110a of the semiconductor substrate 110. In certain embodiments, the interconnection structure 120 may include one or more inter-dielectric layers 122 and one or more patterned conductive layers 124 stacked alternately. In one embodiment, the interconnection structure 120 may be formed in a back-end-of-line (BEOL) process. For example, the inter-dielectric layers 122 may be silicon oxide layers, silicon nitride layers, silicon oxy-nitride layers, or dielectric layers formed by other suitable dielectric materials, and the inter-dielectric layers 122 may be formed by deposition or the like. For example, the patterned conductive layers 124 may be patterned copper layers or other suitable patterned metal layers, and the patterned conductive layers 124 may be formed by electroplating or deposition. However, the disclosure is not limited thereto. In some embodiments, the patterned conductive layers 124 may be formed by dual-damascene method.

As shown in FIG. 1, a top surface of a topmost layer of the patterned conductive layers 124 is accessibly revealed by a topmost layer of the inter-dielectric layers 122, for example. In addition, there is a high degree of coplanarity between the top surfaces of the topmost layer of the patterned conductive layers 124 and the topmost layer of the inter-dielectric layers 122. The numbers of the layers of the inter-dielectric layers 122 and the patterned conductive layers 124 may be less than or more than what is depicted in FIG. 1, and may be designated based on the demand and/or design layout; the disclosure is not specifically limited thereto.

In one embodiment, the TSVs 130 are embedded in the semiconductor substrate 110, which extends from the active surface 110a into the semiconductor substrate 110. As shown in FIG. 1, for example, top surfaces of the TSVs 130 are exposed by and substantially leveled with the active surface 110a of the semiconductor substrate 110, so that the TSVs 130 are physically connected to a lowest layer of the patterned conductive layers 124 of the interconnection structure 120. In some embodiments, a material of the TSVs 130 may be copper, copper alloy, or other suitable metal material. The number, shape, and dimension of the TSVs 130 can be selected based on demand and are not limited to the disclosure.

In certain embodiments, the semiconductor wafer 200 includes a semiconductor substrate 210 having an active surface 210a, an interconnection structure 220 disposed on the active surface 210a, and through silicon vias (TSVs) 230 embedded in the semiconductor substrate 210 and electrically connected to the interconnection structure 220.

In one embodiment, the material of the semiconductor substrate 210 may include a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components may be formed in a front-end-of-line (FEOL) process. In an alternative embodiment, the semiconductor substrate 110 may be a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In one embodiment, the interconnection structure 220 is formed on the active surface 210a of the semiconductor substrate 210. In certain embodiments, the interconnection structure 220 may include one or more inter-dielectric layers 222 and one or more patterned conductive layers 224 stacked alternately. In one embodiment, the interconnection structure 220 may be formed in a back-end-of-line (BEOL) process. For example, the inter-dielectric layers 222 may be silicon oxide layers, silicon nitride layers, silicon oxy-nitride layers, or dielectric layers formed by other suitable dielectric materials, and the inter-dielectric layers 222 may be formed by deposition or the like. For example, the patterned conductive layers 224 may be patterned copper layers or other suitable patterned metal layers, and the patterned conductive layers 224 may be formed by electroplating or deposition. However, the disclosure is not limited thereto. In some embodiments, the patterned conductive layers 224 may be formed by dual-damascene method.

As shown in FIG. 1, a top surface of a topmost layer of the patterned conductive layers 224 is accessibly revealed by a topmost layer of the inter-dielectric layers 222, for example. In addition, there is a high degree of coplanarity between the top surfaces of the topmost layer of the patterned conductive layers 224 and the topmost layer of the inter-dielectric layers 222. The numbers of the layers of the inter-dielectric layers 222 and the patterned conductive layers 224 may be less than or more than what is depicted in FIG. 1, and may be designated based on the demand and/or design layout; the disclosure is not specifically limited thereto.

In one embodiment, the TSVs 230 are embedded in the semiconductor substrate 210, which are extending from the active surface 210a into the semiconductor substrate 210. As shown in FIG. 1, for example, top surfaces of the TSVs 230 are exposed by and substantially leveled with the active surface 210a of the semiconductor substrate 210, so that the TSVs 230 are physically connected to a lowest layer of the patterned conductive layers 224 of the interconnection structure 220. In some embodiments, a material of the TSVs 230 may be copper, copper alloy, or other suitable metal material. The number, shape, and dimension of the TSVs 230 can be selected based on demand and are not limited to the disclosure.

In one embodiment, the semiconductor substrate 110 may be the same as the semiconductor substrate 210, however the disclosure is not limited thereto. In an alternative embodiment, the semiconductor substrate 110 may be different from the semiconductor substrate 210.

Figure 2:
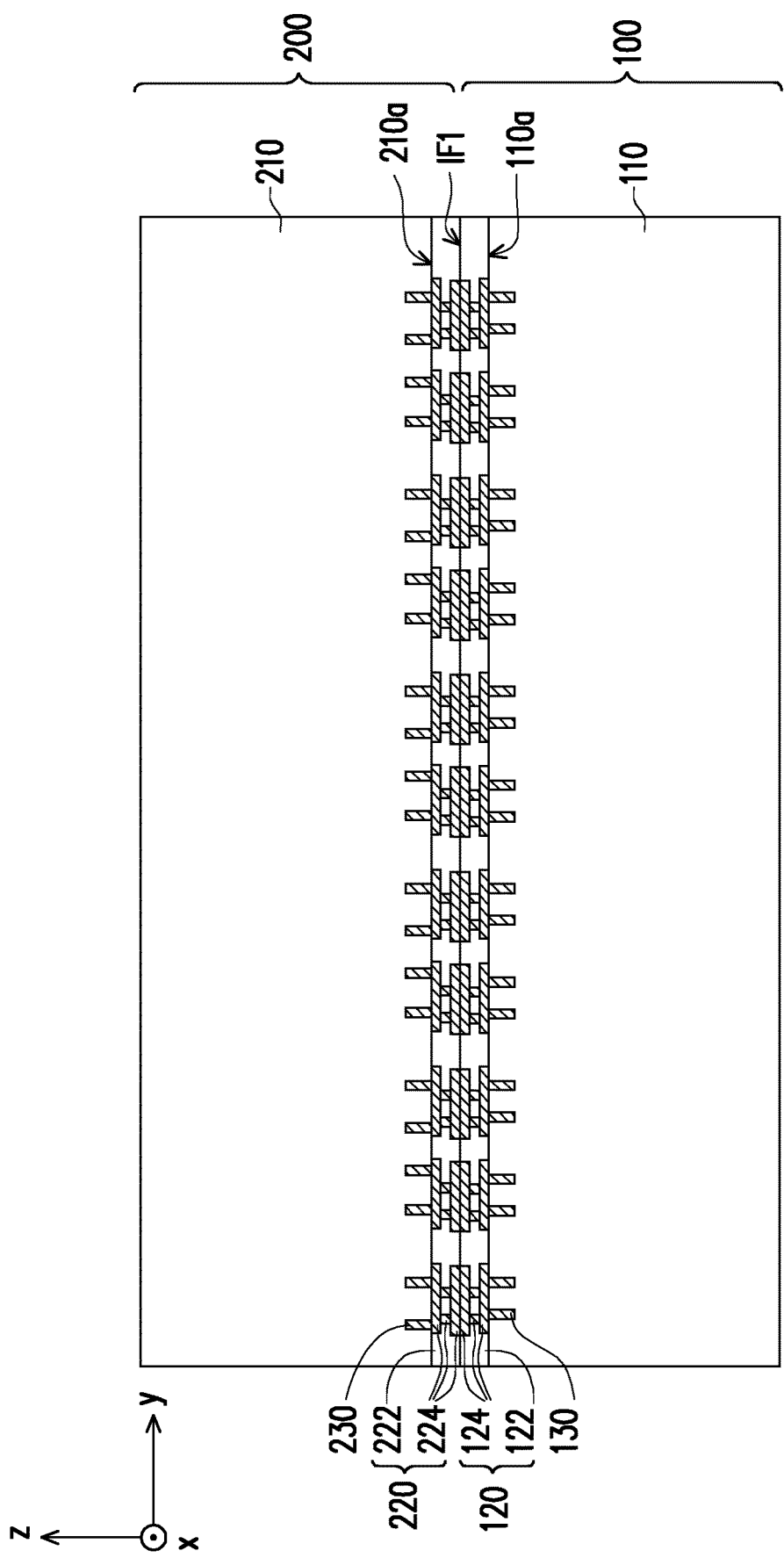

Referring to FIG. 1 and FIG. 2 together, in some embodiments, the semiconductor wafer 200 is picked and placed on the semiconductor wafer 100, and is bonded to the semiconductor wafer 200 by hybrid bonding. As shown in FIG. 1 and FIG. 2, in certain embodiments, the active surface 110a of the semiconductor substrate 110 is facing towards the active surface 210a of the semiconductor substrate 210, where the inter-dielectric layers 122 respectively prop against the inter-dielectric layers 222 and the patterned conductive layers 124 respectively prop against the patterned conductive layers 224. In other words, for example, the inter-dielectric layers 122 are aligned with the inter-dielectric layers 222, and the patterned conductive layers 124 are aligned with the patterned conductive layers 224.

In one embodiment, through the inter-dielectric layers 122, the inter-dielectric layers 222, the patterned conductive layers 124, and the patterned conductive layers 224, the semiconductor wafer 100 and the semiconductor wafer 200 are bonded to each other by hybrid bonding. For example, the hybrid bonding process may include hydrophilic fusion bonding process or hydrophobic fusion bonding process. In one embodiment, a hydrophilic fusion bonding process is performed, where a workable bonding temperature approximately ranges from 200° C. to 400° C. and a workable bonding pressure is approximately greater than 1 J/m$^2$; however, the disclosure is not specifically limited thereto.

In some embodiments, as shown in FIG. 2, after the hybrid bonding process, a bonding interface IF1 is between the semiconductor wafer 100 and the semiconductor wafer 200, where the topmost layer of the inter-dielectric layers 122 of the semiconductor wafer 100 and the topmost layer of the inter-dielectric layers 222 of the semiconductor wafer 200 are physically connected, and the topmost layer of the patterned conductive layers 124 of the semiconductor wafer 100 and the topmost layer of the patterned conductive layers 224 of the semiconductor wafer 200 are physically connected. There is a metal-to-metal bonding between the topmost layer of the patterned conductive layers 124 of the semiconductor wafer 100 and the topmost layer of the patterned conductive layers 224 of the semiconductor wafer 200, and there is a dielectric-to-dielectric bonding between the topmost layer of the inter-dielectric layers 122 of the semiconductor wafer 100 and the topmost layer of the inter-dielectric layers 222 of the semiconductor wafer 200. In other words, the semiconductor substrate 110 and the semiconductor substrate 210 are located at two different sides of the bonding interface IF1, for example. In certain embodiments, as shown in FIG. 2, the semiconductor substrate 110 and the semiconductor substrate 210 are electrically connected to each other through the patterned conductive layers 124 and the patterned conductive layers 224. As shown in FIG. 2, for example, such bonding method is referred to as wafer-to-wafer bonding, however the disclosure is not limited thereto.

Figure 3:
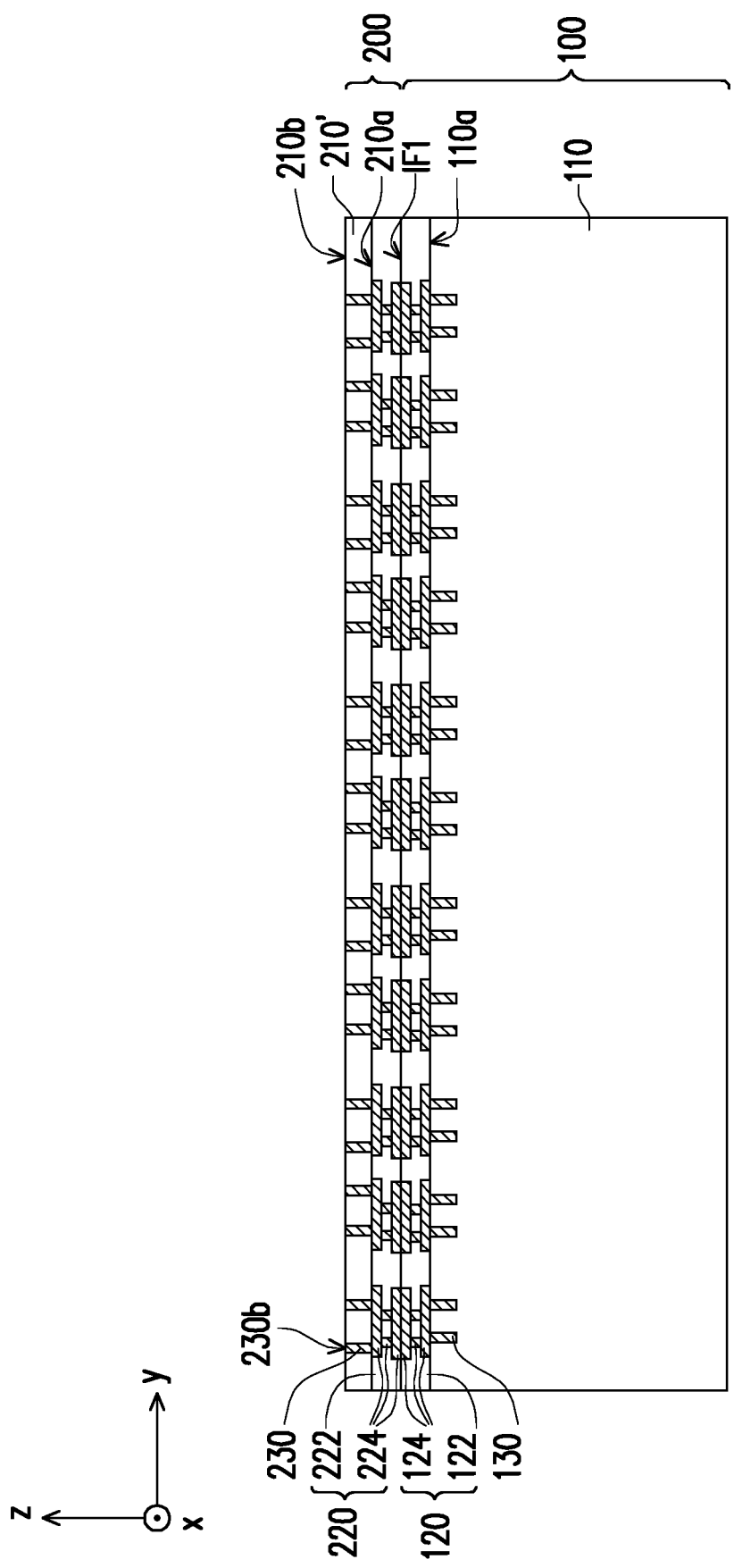

Referring to FIG. 3, in some embodiments, a planarizing step is performed on the semiconductor substrate 210 to expose bottom surfaces 230b of the TSVs 230. As shown in FIG. 3, for example, a portion of the semiconductor substrate 210 is removed to form a semiconductor substrate 210', where a bottom surface 210b of the semiconductor substrate 210' exposes the bottom surfaces 230b of the TSVs 230. In some embodiments, the planarizing step may include a grinding process or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method. As shown in FIG. 3, for example, the bottom surfaces 230b of the TSVs 230 is substantially leveled with the bottom surface 210b of the semiconductor substrate 210'. In other words, the bottom surfaces 230b of the TSVs 230 are substantially coplanar to the bottom surface 210b of the semiconductor substrate 210'. There is a high degree of coplanarity between the bottom surfaces 230b of the TSVs 230 and the bottom surface 210b of the semiconductor substrate 210'. Due to the high degree of coplanarity and flatness, the formation of the later-formed layer(s) is beneficial.

Figure 25:
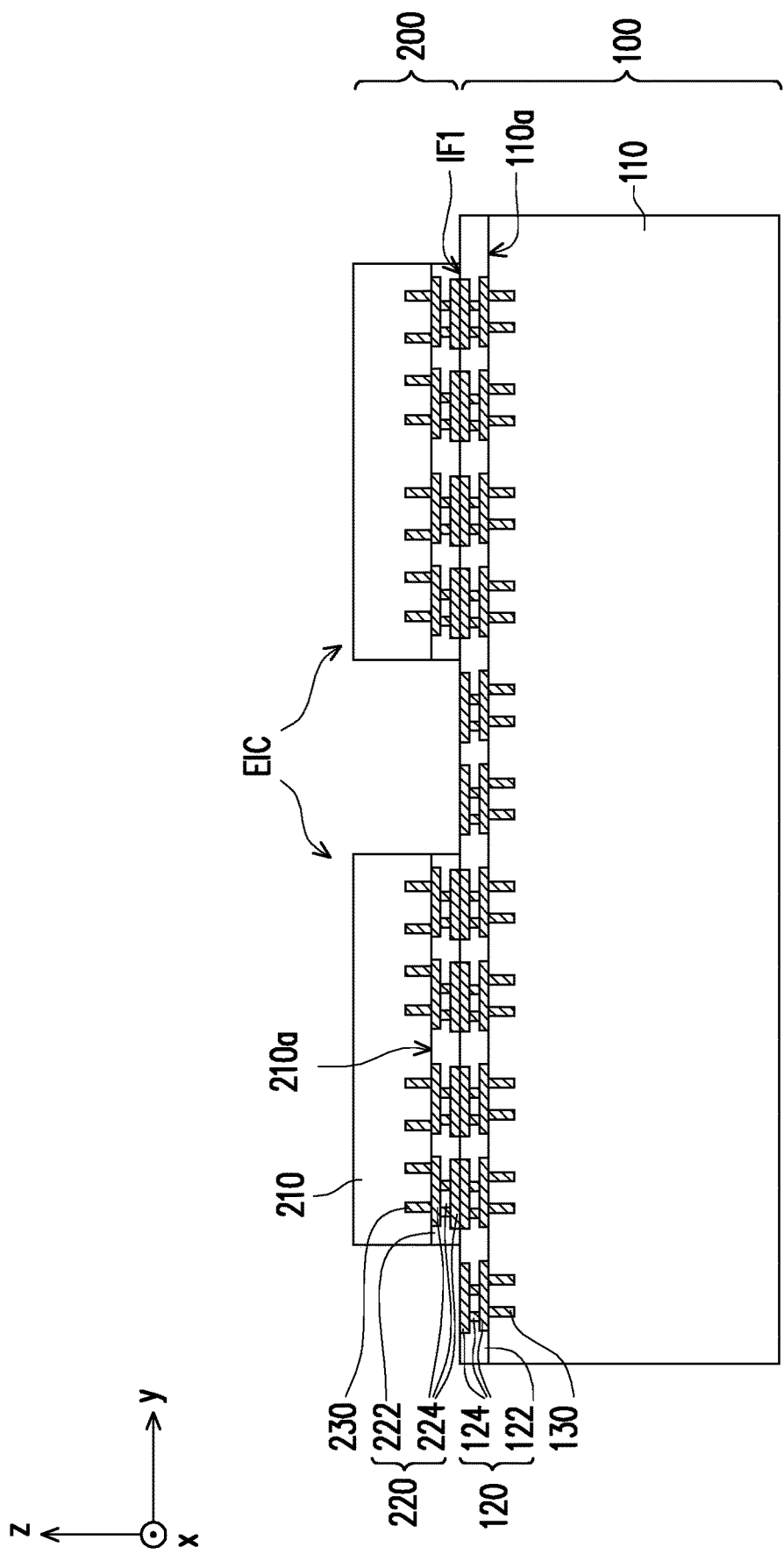
FIG. 25 to FIG. 27 are schematic cross sectional views of a part of various stages in a manufacturing method of a package structure in accordance with some embodiments of the disclosure.
Figure 26:
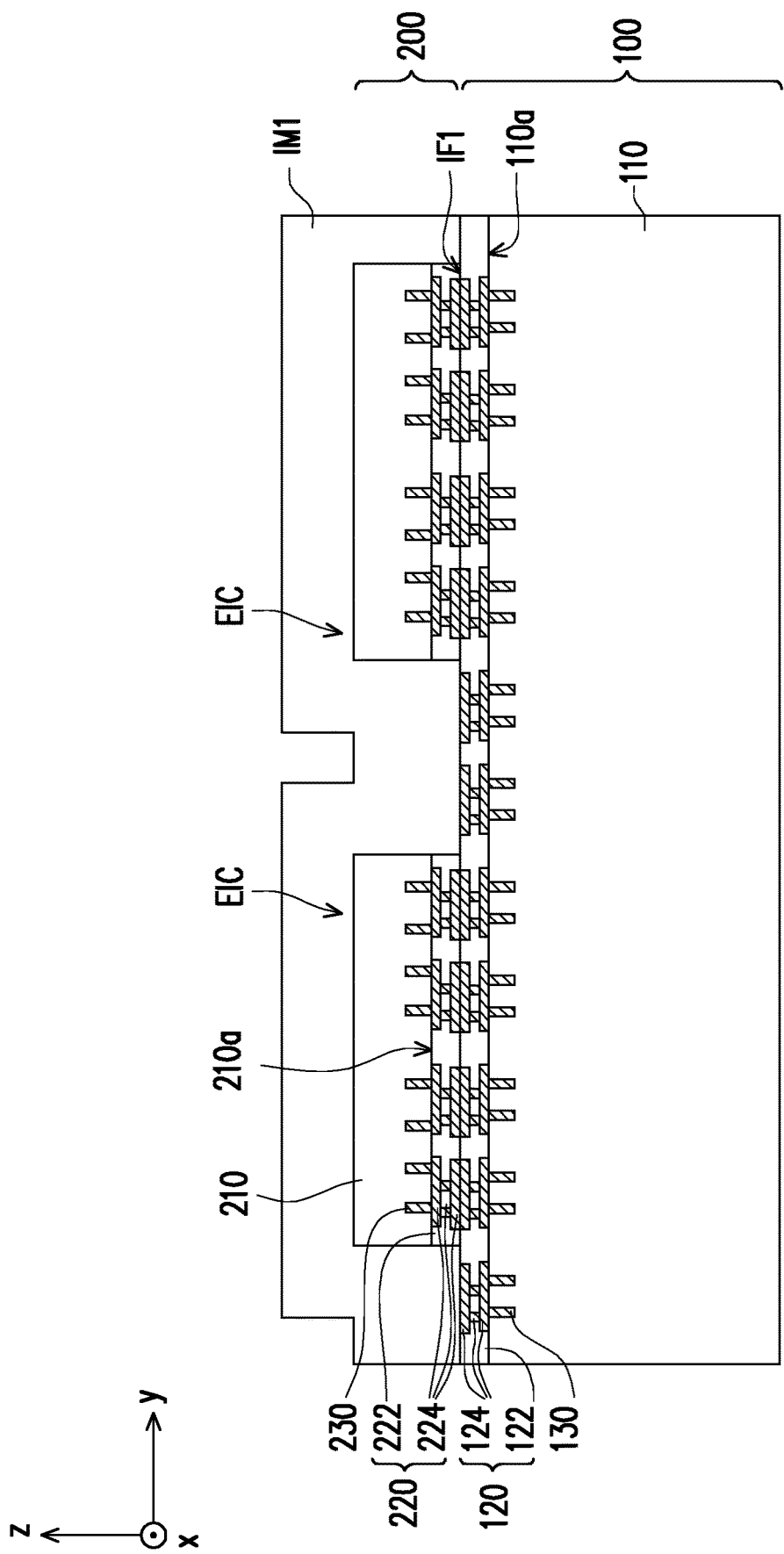
Figure 27:
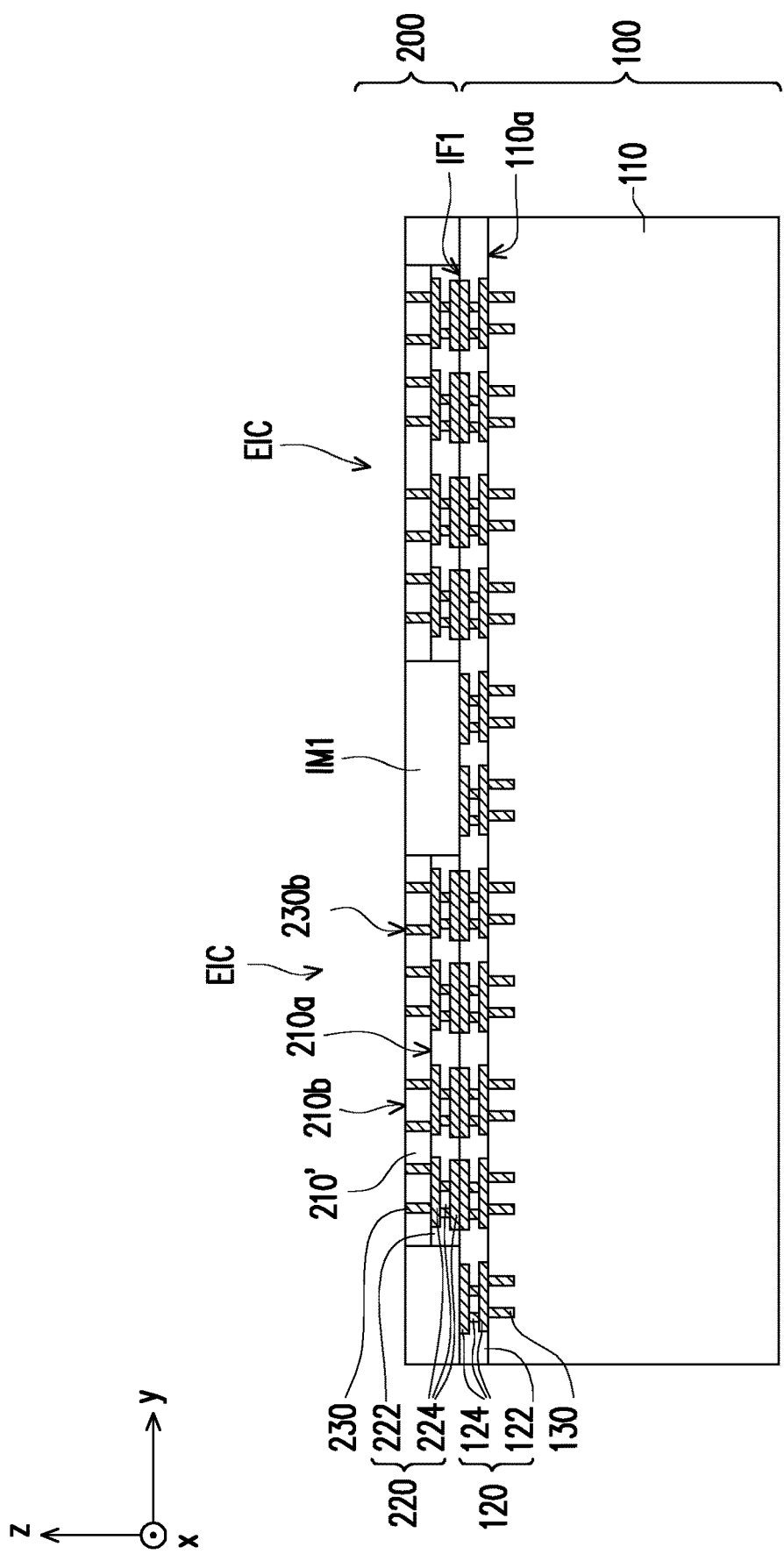

In an alternative embodiment, a bonding method of chip-to-wafer depicted in FIG. 25 to FIG. 27 may be used to replace the processes described in FIG. 1 to FIG. 3. For example, prior to the hybrid bonding process, a dicing (or singulation) process is performed on the semiconductor wafer 200 to form a plurality of portions which are referred to as electric integrated circuit components EIC. In some embodiments, as shown in FIG. 25, the integrated circuit components EIC are picked and placed on the semiconductor wafer 100, where the inter-dielectric layers 122 of the semiconductor wafer 100 are aligned with the inter-dielectric layers 222 of the integrated circuit components EIC, and the patterned conductive layers 124 of the semiconductor wafer 100 are aligned with the patterned conductive layers 224 of the integrated circuit components EIC, and the aforementioned hydrophilic fusion bonding process is performed to bond the integrated circuit components EIC onto the semiconductor wafer 100. As shown in FIG. 26, in some embodiments, an insulating encapsulant IM1 is then formed to cover the semiconductor wafer 100 and encapsulate the integrated circuit components EIC. The maximum thickness of the insulating encapsulant IM1 may be greater than the thickness of the integrated circuit components EIC. In some embodiments, the insulating encapsulant IM1 may be conformally formed by a chemical vapor deposition (CVD) process, or other suitable deposition processes. Furthermore, the insulating encapsulant IM1 may include silicon oxide, silicon nitride, and/or tetraethoxysilane (TEOS), which is optically transparent to an optical signal. In some embodiments, the semiconductor substrate 210 may undergoes a pre-thinning process to facilitate the formation of the insulating encapsulant IM1. For example, the above pre-thinning process may include a CMP process, a mechanical grinding process, the combination thereof or other suitable removal processes. Then, as shown in FIG. 27, a grinding or polishing process is performed on the insulating encapsulant IM1 so as to partially remove the insulating encapsulant IM1 and the integrated circuit components EIC until the TSVs 230 of the integrated circuit components EIC are exposed, in some embodiments. For example, the insulating encapsulant IM1 and the integrated circuit components EIC may be partially removed by a CMP process, a mechanical grinding process, the combination thereof or other suitable removal processes. After performing the grinding or polishing process, the integrated circuit components EIC are laterally encapsulated by the insulating encapsulant IM1, and the grinded or polished surfaces of the integrated circuit components EIC and the insulating encapsulant IM1 are substantially coplanar to each other. Furthermore, the insulating encapsulant IM1 physically contacts sidewalls of the integrated circuit components EIC. In an alternative embodiment, the applications to the semiconductor wafer 100 and the semiconductor wafer 200 may be switched in the processes described in FIG. 25 to FIG. 27.

Figure 4:
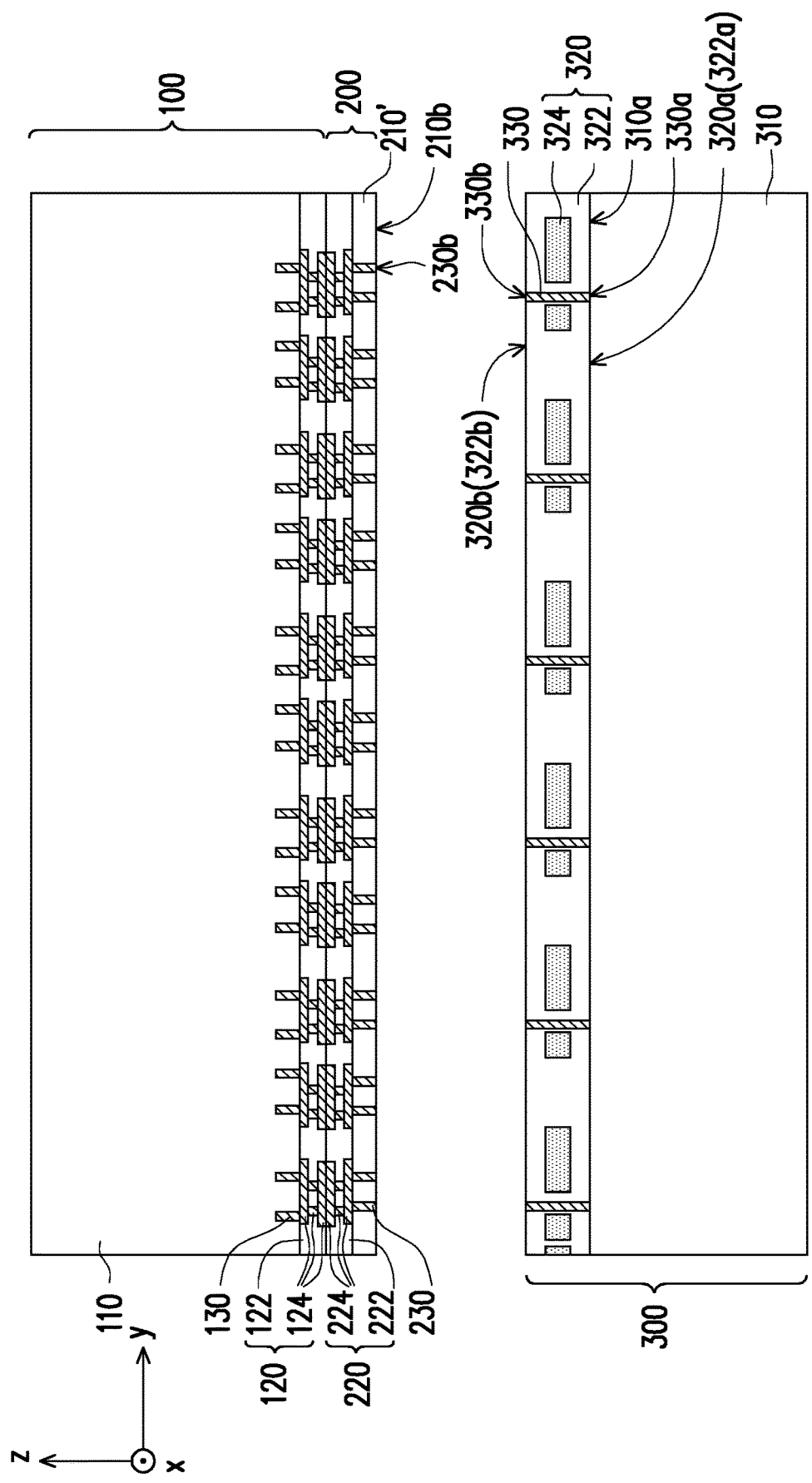

Referring to FIG. 4, in some embodiments, a semiconductor wafer 300 is provided. In certain embodiments, the semiconductor wafer 300 includes a semiconductor substrate 310 having a surface 310a, an optical waveguide layer 320 disposed on the surface 310a, and conductive vias 330 disposed in the optical waveguide layer 320.

In one embodiment, the semiconductor substrate 310 is a supporting carrier of formations the optical waveguide layer 320 and the conductive vias 330. The semiconductor substrate 310 may be, for example, a bare silicon substrate, a reclaim silicon substrate or the like. However, the disclosure is not limited thereto. In some embodiments, the material of the semiconductor substrate 310 may be the same as the materials of the semiconductor substrates 110 and 210. In other embodiments, the material of the semiconductor substrate 310 may be the different from the materials of the semiconductor substrates 110 and 210.

In one embodiment, the conductive vias 330 penetrate through the optical waveguide layer 320 and physically contact the surface 310a of the semiconductor substrate 310. As shown in FIG. 4, top surfaces 330a of the conductive vias 330 are substantially leveled with and coplanar to a top surface 320a of the optical waveguide layer 320, and bottom surfaces 330b of the conductive vias 330 are substantially leveled with and coplanar to a bottom surface 320b of the optical waveguide layer 320. In other words, the bottom surfaces 330b of the conductive vias 330 are accessibly revealed by the optical waveguide layer 320 for electrically connection with later-formed component(s), for example. In some embodiments, the conductive vias 330 may be patterned copper layers or other suitable patterned metal layers, and the conductive vias 330 may be formed by electroplating, etching, and plating/deposition processes, the disclosure is not limited thereto.

In one embodiment, as shown in FIG. 4, the optical waveguide layer 320 include a first dielectric layer 322 and a second dielectric layer 324, where the second dielectric layer 324 is embedded in the first dielectric layer 322. In some embodiments, the first dielectric layer 322 and the second dielectric layer 324 may be made of dielectric materials, such as silicon oxide (SiOx, where x>0), silicon oxynitride (SiOxNy, where x, y>0), silicon nitride (SiNx, where x>0), low-k materials, or combinations thereof, and may be formed by using a CVD process. In some embodiments, the second dielectric layer 324 may be made of silicon, and may be formed by deposition.

In the disclosure, the second dielectric layer 324 serves as an optical signal channel to transmit the optical signal, where the refractive index of the second dielectric layer 324 is greater than the refractive index of the first dielectric layer 322. For example, the first dielectric material layer 322 may be made of silicon oxide, and the second dielectric material layer 324 may be made of silicon nitride. However, the disclosure is not limited thereto, and in an alternative embodiment, other applicable materials may be included for the first dielectric material layer 322 and the second dielectric material layer 324 as long as the above condition (the refractive index of the second dielectric layer 324 being greater than the refractive index of the first dielectric layer 322) has been satisfied. The optical signal is, for example, pulsed light, light with continuous wave (CW) or the combinations thereof.

In an alternative embodiment, the optical waveguide layer 320 may include one or a plurality of the first dielectric layers 322 and one or a plurality of the second dielectric layers 324, where each second dielectric layer 324 is sandwiched between two adjacent first dielectric layers 322, so as to form a multiple layer structure. In such embodiment, forming layers of the second dielectric layers 324 located at different levels in a stacking direction Z thereof inside the multiple layer structure may be interconnected (with feature(s) made of the same material as that of the second dielectric layer 324) to facilitate the transmission of optical signal therethrough. In other words, the optical signal may be transmitted among the different layers of the second dielectric layers 324, for example. However, the disclosure is not limited thereto.

Figure 5:
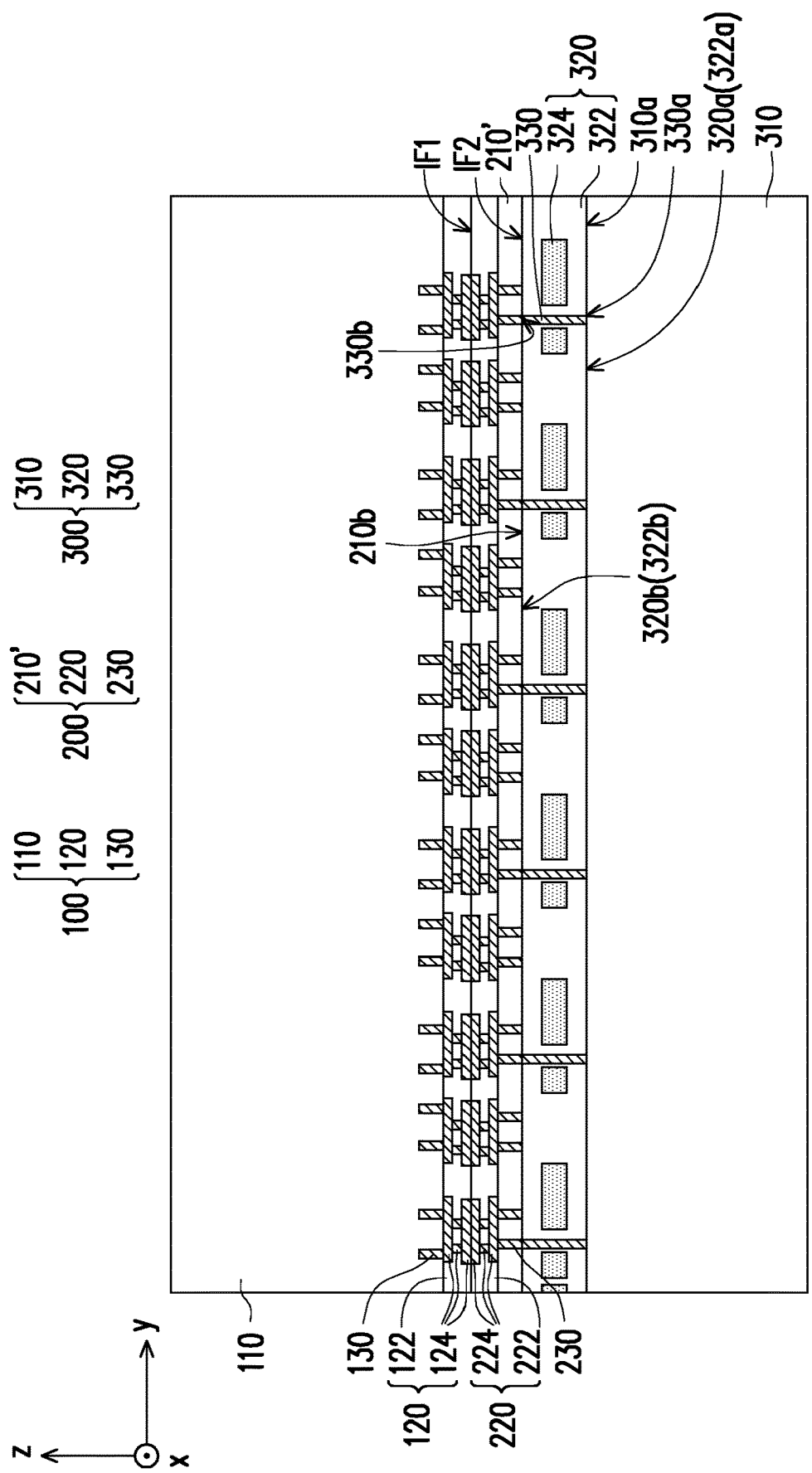

Referring to FIG. 4 and FIG. 5 together, in some embodiments, the structure (e.g. the semiconductor wafer 200 bonded with the semiconductor wafer 100) depicted in FIG. 3 is picked and placed on the semiconductor wafer 300, and is bonded to the semiconductor wafer 300 by hybrid bonding. As shown in FIG. 4 and FIG. 5, in certain embodiments, the bottom surface 210b of the semiconductor substrate 210' is facing towards the bottom surface 320b of the optical waveguide layer 320, where the TSVs 230 are physically contacted to the conductive vias 330 and the topmost layer of the inter-dielectric layers 222 is physically contacted to a surface of the first electric layer 322 facing away from the surface 310a of the semiconductor substrate 310. In one embodiment, through semiconductor substrate 210', the TSVs 230, the first electric layer 322 and the conductive vias 330, the semiconductor wafer 200 bonded with the semiconductor wafer 100 is further bonded to the semiconductor wafer 300 by hybrid bonding. For example, the hybrid bonding process may include hydrophilic fusion bonding process or hydrophobic fusion bonding process. In one embodiment, a hydrophilic fusion bonding process is performed, where a workable bonding temperature approximately ranges from 200° C. to 400° C. and a workable bonding pressure is approximately greater than 1 J/m$^2$; however, the disclosure is not specifically limited thereto.

In some embodiments, as shown in FIG. 5, after the hybrid bonding process, a bonding interface IF2 is between the semiconductor wafer 200 and the semiconductor wafer 300, where the TSVs 230 of the semiconductor wafer 200 and the conductive vias 330 of the semiconductor wafer 300 are physically connected, and the semiconductor substrate 210' of the semiconductor wafer 200 and the first dielectric layer 322 of the semiconductor wafer 300 are physically connected. There is a metal-to-metal bonding between the TSVs 230 of the semiconductor wafer 200 and the conductive vias 330 of the semiconductor wafer 300, and there is a dielectric-to-dielectric bonding between the semiconductor substrate 210' of the semiconductor wafer 200 and the first dielectric layer 322 of the semiconductor wafer 300. In other words, the semiconductor substrate 210' and the semiconductor substrate 310 are located at two different sides of the bonding interface IF2, and the semiconductor substrate 210' and the semiconductor substrate 110 and the semiconductor substrate 310 are located at two different sides of the bonding interface IF2, for example. In certain embodiments, as shown in FIG. 5, the TSVs 130 and the conductive vias 330 are electrically connected to each other through the patterned conductive layers 124, the patterned conductive layers 224, and the TSVs 230. As shown in FIG. 5, for example, such bonding method is referred to as wafer-to-wafer bonding, however the disclosure is not limited thereto.

Figure 6:
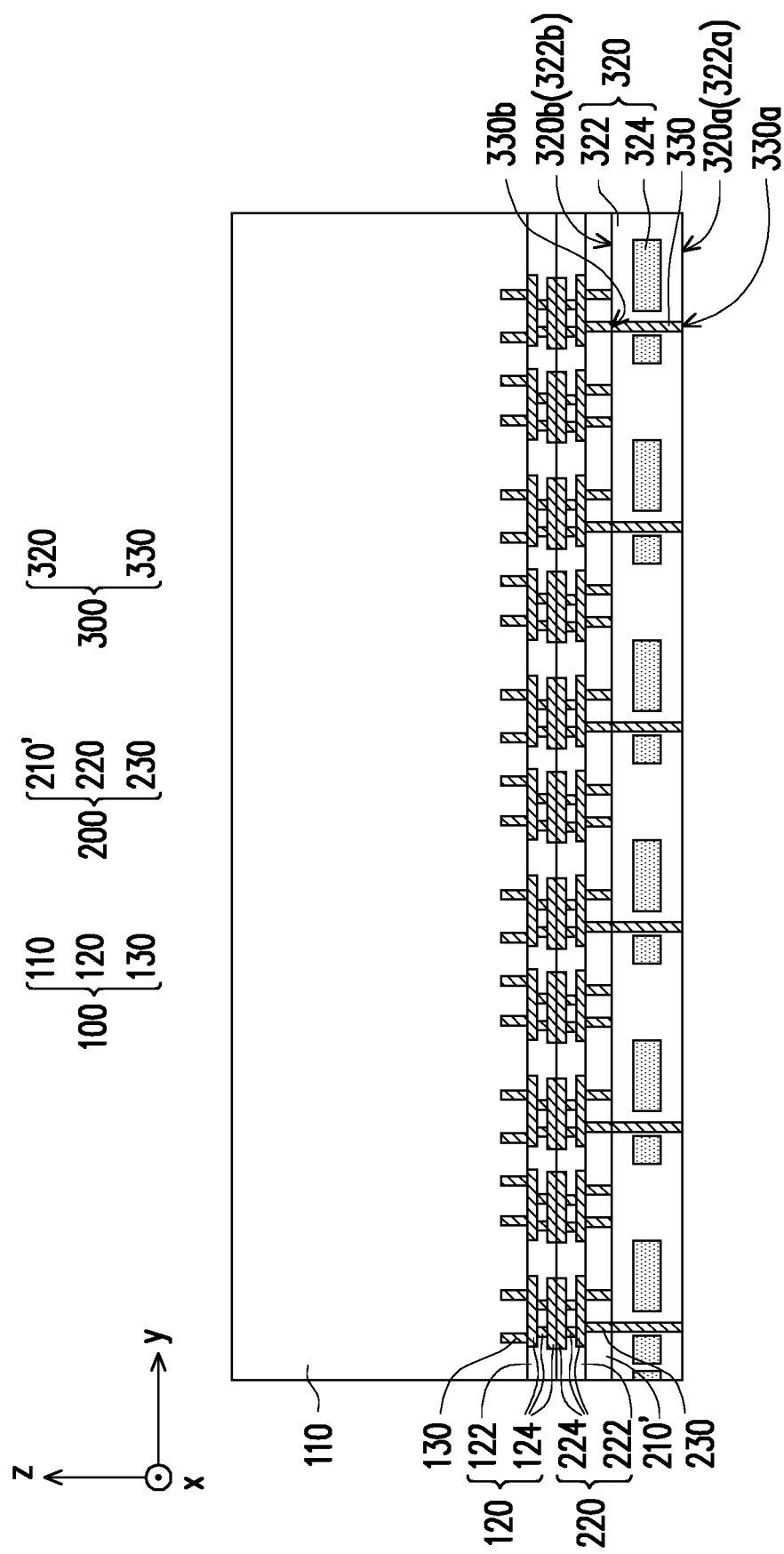

Referring to FIG. 6, in some embodiments, a planarizing step is performed to remove the semiconductor substrate 310 from the semiconductor wafer 300, and the top surfaces 330a of the conductive vias 330 are accessibly revealed by the top surface 320a of the optical waveguide layer 320 (e.g. the top surface 322a of the first dielectric layer 322). In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method. As shown in FIG. 6, for example, the top surfaces 330a of the conductive vias 330 are substantially leveled with and coplanar to the top surface 320a of the optical waveguide layer 320. There is a high degree of coplanarity between the top surfaces 330a of the conductive vias 330 and the top surface 320a of the optical waveguide layer 320.

Figure 28:
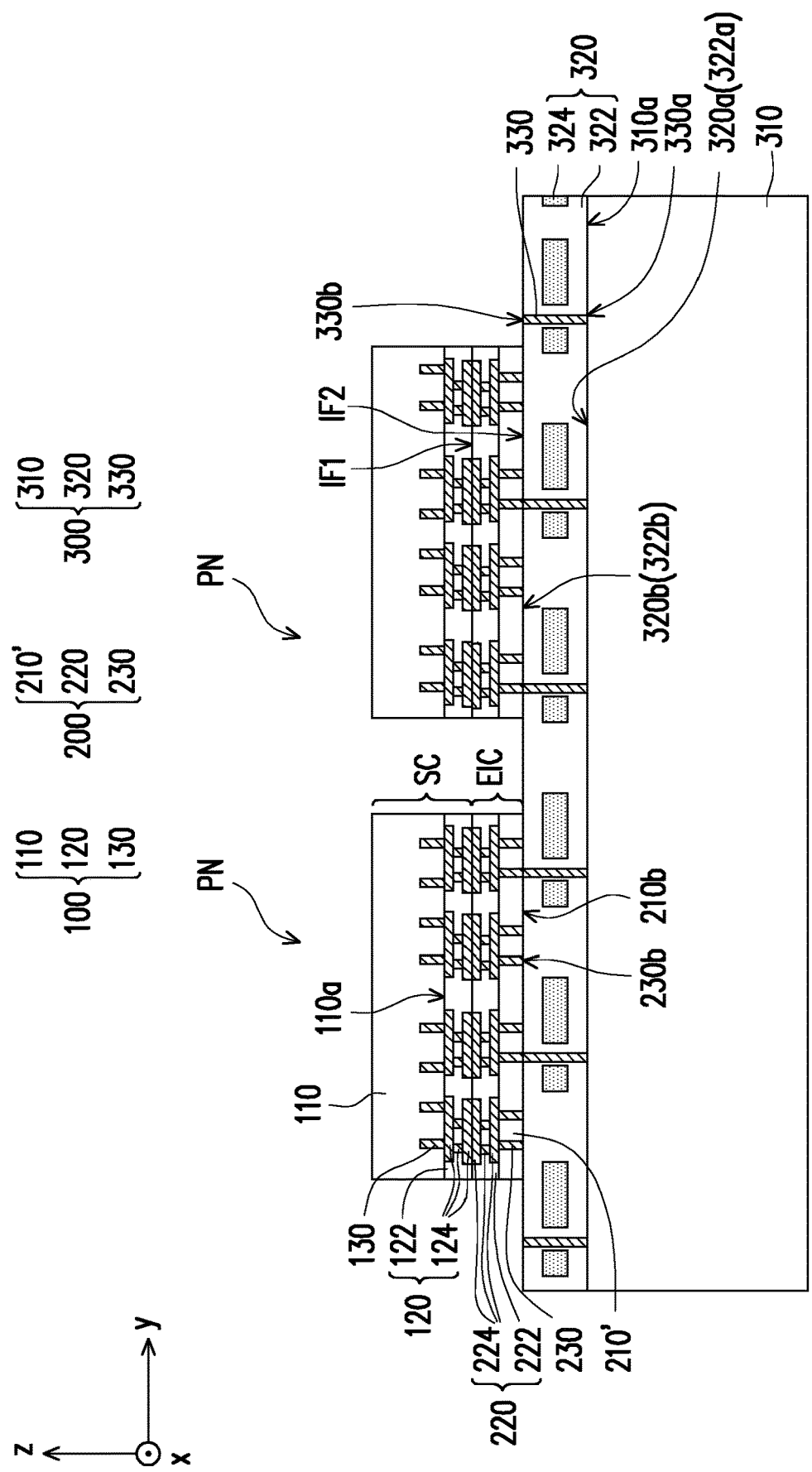
FIG. 28 to FIG. 30 are schematic cross sectional views of a part of various stages in a manufacturing method of a package structure in accordance with some embodiments of the disclosure.
Figure 29:
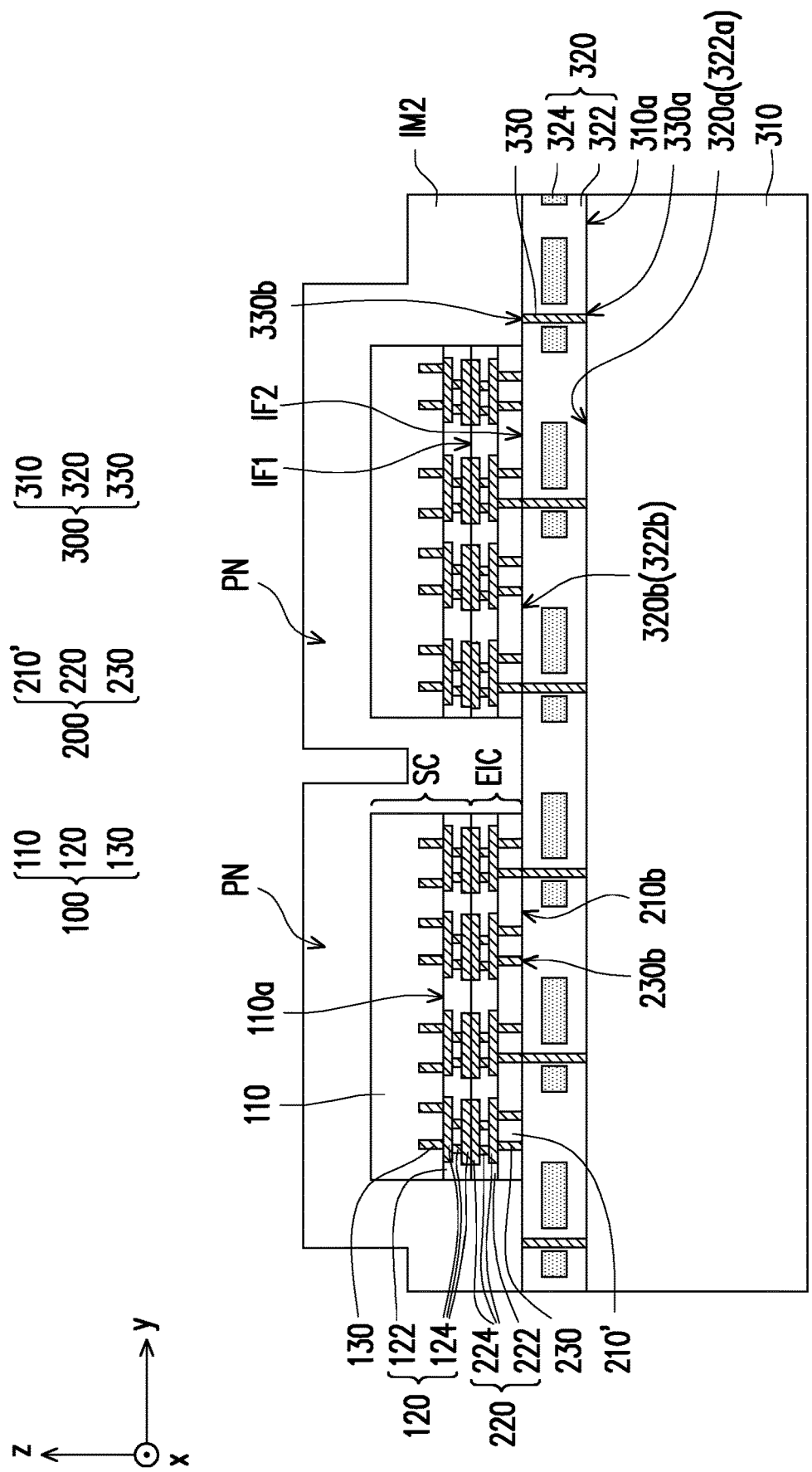
Figure 30:
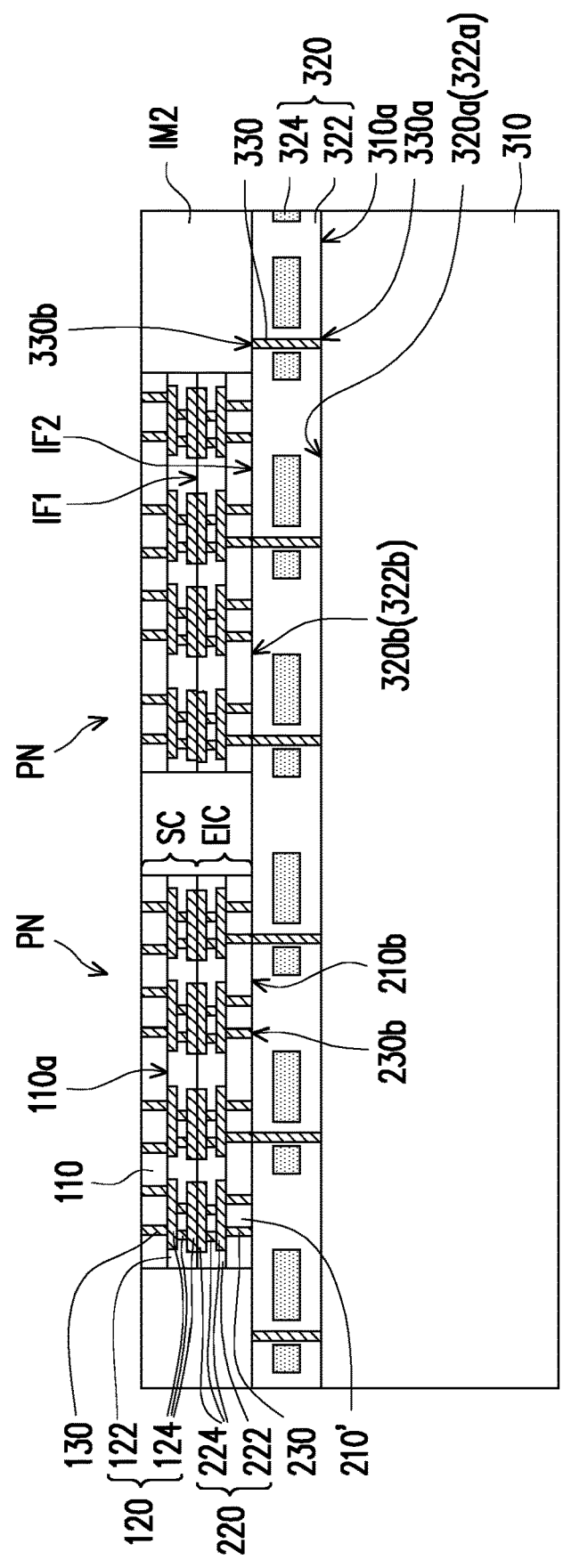

In an alternative embodiment, a bonding method of chip-to-wafer depicted in FIG. 28 to FIG. 30 may be used to replace the processes described in FIG. 4 to FIG. 6. For example, prior to the hybrid bonding process, a dicing (or singulation) process is performed on the structure (e.g. the semiconductor wafer 200 bonded with the semiconductor wafer 100) depicted in FIG. 3 to form a plurality of portions PN each including a portion of the semiconductor wafer 200 (e.g. one electric integrated circuit component EIC) and a portion of the semiconductor wafer 100 (which is referred to as a semiconductor chip SC). In some embodiments, as shown in FIG. 28, the portions PN (each including one electric integrated circuit component EIC and one semiconductor chip SC) are picked and placed on the semiconductor wafer 300, where the inter-dielectric layers 222 of the semiconductor wafer 200 are aligned with the first electric layer 322 of the semiconductor wafer 300, and the patterned conductive layers 224 of the semiconductor wafer 200 are aligned with the conductive vias 330 of the semiconductor wafer 300, and the aforementioned hydrophilic fusion bonding process is performed to bond the portions PN onto the semiconductor wafer 300. As shown in FIG. 29, in some embodiments, an insulating encapsulant IM2 is then formed to cover the semiconductor wafer 300 and encapsulate the portions PN. The maximum thickness of the insulating encapsulant IM2 may be greater than the thickness of the portions PN. In some embodiments, the insulating encapsulant IM2 may be conformally formed by a CVD process, or other suitable deposition processes. Furthermore, the insulating encapsulant IM2 may include silicon oxide, silicon nitride, and/or tetraethoxysilane (TEOS), which is optically transparent to an optical signal. In some embodiments, the semiconductor substrate 110 may undergoes a pre-thinning process to facilitate the formation of the insulating encapsulant IM2. For example, the above pre-thinning process may include a CMP process, a mechanical grinding process, the combination thereof or other suitable removal processes. Then, as shown in FIG. 30, a grinding or polishing process is performed on the insulating encapsulant IM2 so as to partially remove the insulating encapsulant IM2 and the portions PN until the conductive vias 330 of the portions PN are exposed, in some embodiments. For example, the insulating encapsulant IM2 and the portions PN may be partially removed by a CMP process, a mechanical grinding process, the combination thereof or other suitable removal processes. After performing the grinding or polishing process, the portions PN are laterally encapsulated by the insulating encapsulant IM2, and the grinded or polished surfaces of the portions PN and the insulating encapsulant IM2 are substantially coplanar to each other. Furthermore, the insulating encapsulant IM2 physically contacts sidewalls of the portions PN.

Figure 7:
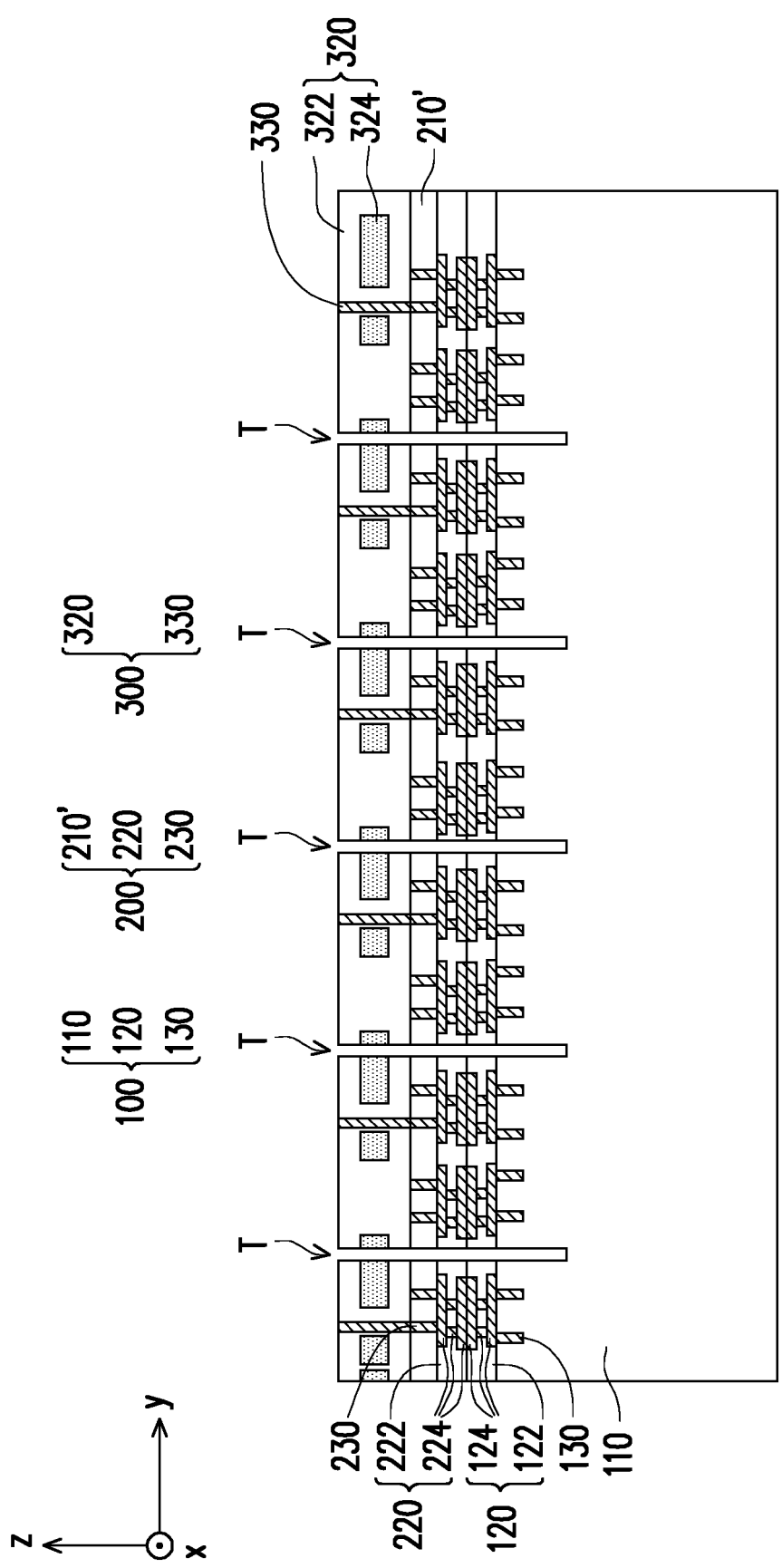

Referring to FIG. 7, in some embodiments, a dicing (or singulation) process is performed. For example, the whole structure depicted in FIG. 6 are flipped (turned upside down), and the dicing (or singulation) process is sequentially performed to cut through the semiconductor wafer 300, the semiconductor wafer 200, and a portion of the semiconductor wafer 100 and form trenches T. In other words, the dicing process is performed to cut at least the optical waveguide layer 320, the semiconductor substrate 210', the interconnection structure 220, the interconnection structure 120, and a portion of the semiconductor substrate 110. In some embodiments, the dicing process is a wafer dicing process, which may include mechanical blade sawing or laser cutting. The disclosure is not limited thereto.

Figure 8:
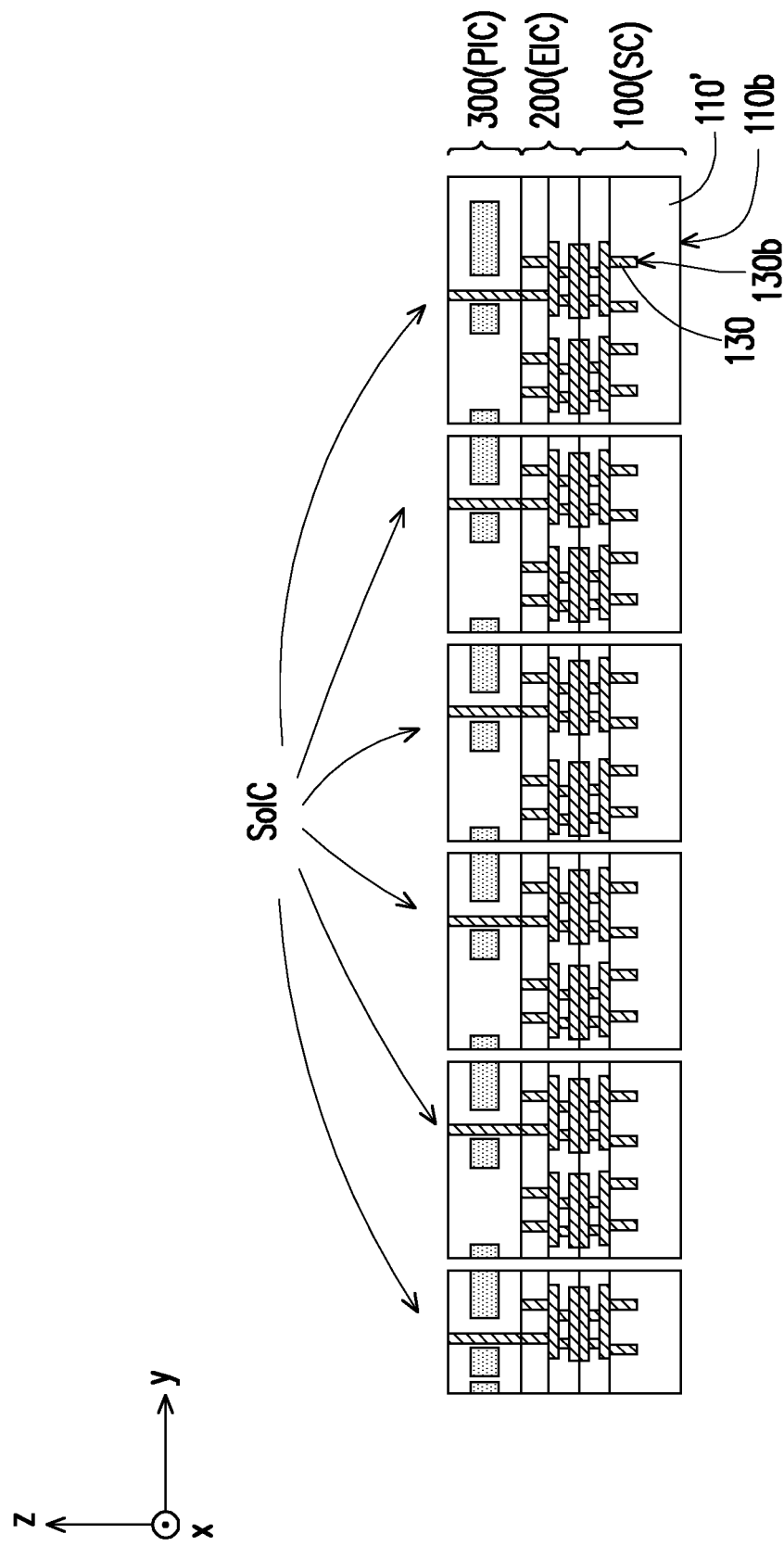

Referring to FIG. 8, in some embodiments, a planarizing process is performed on the semiconductor wafer 100 to partially remove the semiconductor substrate 110 to form a plurality of system-on-integrated circuits SoIC which are separated from one another. In other words, the planarizing process is applied to separate a plurality of the system-on-integrated circuits SoIC interconnected therebetween into individual and separated system-on-integrated circuits SoIC. For example, a portion of the semiconductor substrate 110 (e.g. a portion of the semiconductor substrate 110 underneath the trenches T in the direction Z) is removed by the planarizing process to form a plurality of system-on-integrated circuits SoIC, where a remained semiconductor substrate 110' still covers bottom surfaces 130b of the TSVs 130.

In some embodiments, the planarizing step may include a grinding process or a CMP process. After the planarizing step, a cleaning step may be optionally performed, for example to clean and remove the residue generated from the planarizing step. However, the disclosure is not limited thereto, and the planarizing step may be performed through any other suitable method. There is a high degree of coplanarity between the bottom surfaces 110b of the semiconductor substrates 110' in the separated system-on-integrated circuits SoIC, and the formation of the later-formed layer(s) is beneficial.

In some embodiments, prior to the planarizing process, a holding device (not shown) is adopted to secure the structure depicted in FIG. 7 through holding the optical waveguide layer 320 to avoid any damage occurred during the planarizing process or any transportation. For example, the holding device may be an adhesive tape, a carrier film or a suction pad, the disclosure is not limited thereto. Up to this, the manufacture of the system-on-integrated circuits SoIC is completed.

In the embodiments of the disclosure, as shown in FIG. 8, in each system-on-integrated circuit SoIC herein, the portion of the semiconductor wafer 300 having the optical waveguide layer 320 is referred to as a photonic integrated circuit component PIC, the portion of the semiconductor wafer 200 is referred to as the electric integrated circuit component EIC, and the portion of the semiconductor wafer 100 is referred to as the semiconductor chip SC. In some embodiments, as shown in FIG. 8, each system-on-integrated circuit SoIC includes the photonic integrated circuit component PIC, the electric integrated circuit component EIC, and the semiconductor chip SC that are bonded (electrically connected) to each other, and are stacked on each other along the direction Z. However, the disclosure is not limited thereto; in an alternative embodiment, each system-on-integrated circuit SoIC may include the photonic integrated circuit component PIC bonded (electrically connected) to the electric integrated circuit component EIC or the semiconductor chip SC (e.g. using the processes described in FIG. 25 to FIG. 27 and/or processes described in FIG. 28 to FIG. 30 and then followed by the processes described in FIG. 7 to FIG. 8). In other words, in the disclosure, each system-on-integrated circuit SoIC at least includes the photonic integrated circuit component PIC.

In some embodiments, the semiconductor chip SC may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor chip SC may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto. In an alternative embodiment, the semiconductor chip SC may further be equipped with one or more memory devices. In a further alternative embodiment, the semiconductor chip SC may be a dummy semiconductor chip.

In some embodiments, the electric integrated circuit component EIC is a driver integrated circuit (IC), and includes one or more semiconductor devices (e.g. active components and/or passive components), wirings or conductors for electrical connection. Examples of active components include, but are not limited to, diodes, field effect transistors (FETs), metal-oxide-semiconductor FETs (MOSFETs), complementary metal-oxide-semiconductor (CMOS) transistors, and bipolar transistors. Examples of passive components include, but are not limited to, resistors, capacitors, and inductors.

In some embodiments, the photonic integrated circuit component PIC is configured to process, receive, and/or transmit optical signals. The photonic integrated circuit component PIC is thus also being referred to as an optical chip in some applications. For example, the optical signals are electromagnetic signals exhibiting a characteristic capable of being modeled by photons and are different from electrical signals which are signals carried by electrical charges, such as electrons, holes, or ions. In alternative embodiments, the photonic integrated circuit component PIC further includes one or more active and/or passive components configured to process, receive and/or transmit electrical signals converted to/from optical signals by the laser die. In alternative embodiments, the photonic integrated circuit component PIC further includes light detecting devices such as photo-sensors.

Figures 9A, 9B:
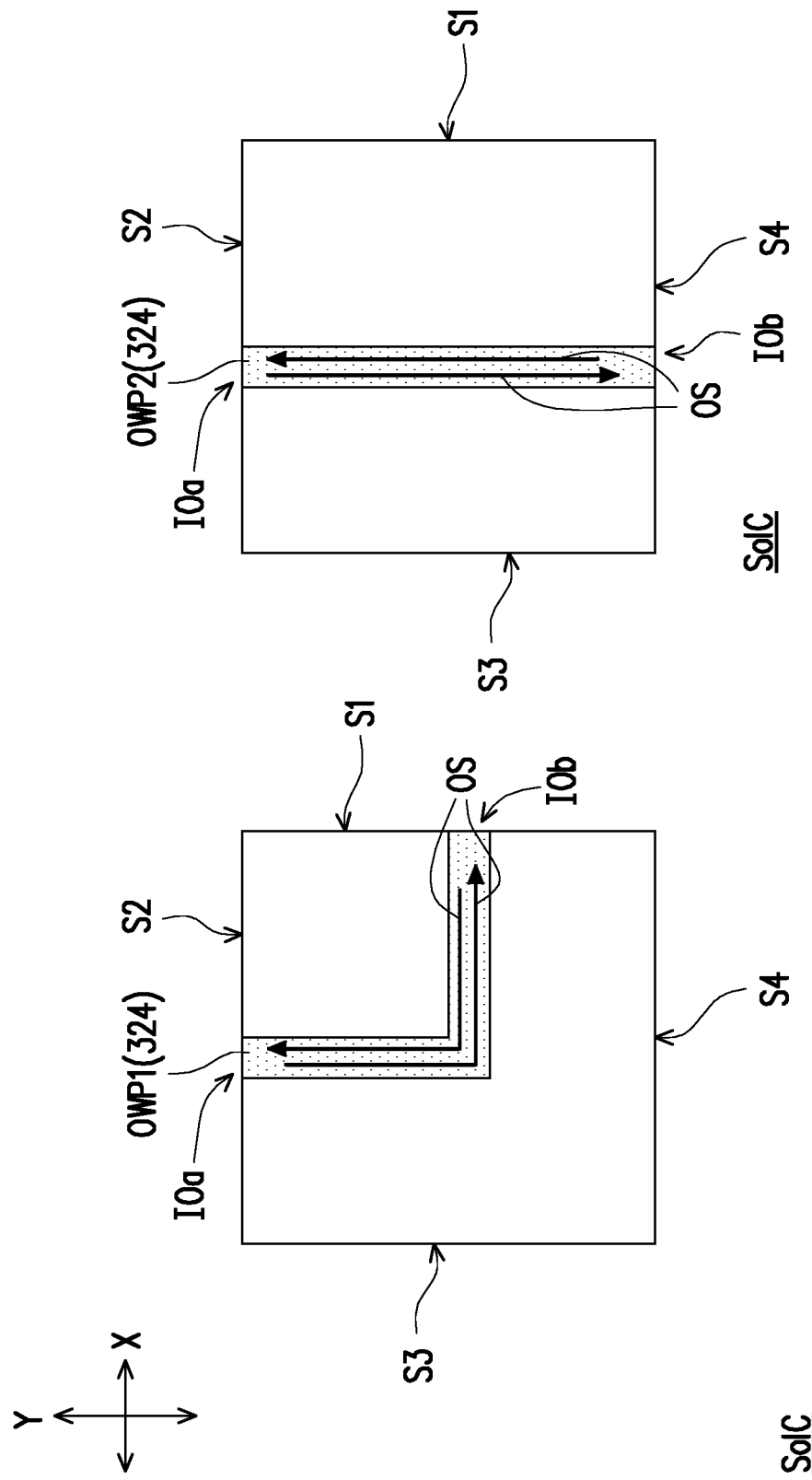

As mentioned above, the second dielectric layer 324 embedded in the optical waveguide layer 320 of the semiconductor wafer 300 serves as the optical signal channel. For one example, in some of the system-on-integrated circuits SoIC, the second dielectric layer 324 (e.g. an optical waveguide path OWP1 depicted in FIG. 9A) may include a pattern in a form of curved line having an included angle greater than 0 degree and less than 180 degrees, where the optical waveguide path OWP1 has one exiting port IOa and one exiting port IOb. As shown in FIG. 9A, in one embodiment, if considering the top view of each system-on-integrated circuit SoIC is a rectangular shape having edges S1~S4, the second dielectric layer 324 may extend from an edge S1 to an edge S2, where the edge S2 is non-parallel and adjacent to the edge S1 and an end of the edge S2 is in contact with an end of the edge S1. In other words, the optical waveguide path OWP1 depicted in FIG. 9A is in a form of a curved line having an included angle greater than 0 degree and less than 180 degrees and has the exiting port IOa at the edge S2 and the exiting port IOb at the edge S1, where the optical signal OS can be transmitted in both directions X and Y. The direction X and the direction Y are different from each other and are different from the direction Z. In one embodiment, the direction X and the direction Y are perpendicular to each other and perpendicular to the direction Z. However, the disclosure is not limited thereto; and in an alternative embodiment, the optical waveguide path OWP1 may include a plurality of exiting ports IOa and a plurality of exiting ports IOb, as shown in FIG. 9C. In a further alternative embodiment, the optical waveguide path OWP1 may include more than one included angle greater than 0 degree and less than 180 degrees and has one or more exiting ports IOa and/or one or more exiting ports IOb.

For another example, in some of the system-on-integrated circuits SoIC, the second dielectric layer 324 (e.g. an optical waveguide path OWP2 depicted in FIG. 9B) may include a pattern in a form of straight line, where the optical waveguide path OWP2 has one exiting port IOa and one exiting port IOb. As shown in FIG. 9B, in one embodiment, if considering a top view of each system-on-integrated circuit SoIC is a rectangular shape having edges S1~S4, the second dielectric layer 324 may extend from an edge S2 to an edge S4, where the edge S2 is parallel and opposite to the edge S4 and the edge S2 is not in contact with the edge S4. In other words, the optical waveguide path OWP2 depicted in FIG. 9B is in a form of a straight line and has the exiting port IOa at the edge S2 and the exiting port IOb at the edge S4, where the optical signal OS can be transmitted in either the direction X or the direction Y. However, the disclosure is not limited thereto; and in an alternative embodiment, the optical waveguide path OWP2 may include a plurality of exiting ports IOa and a plurality of exiting ports IOb, as shown in FIG. 9D. For simplicity, a top view of one of the system-on-integrated circuits SoIC shown in FIG. 9A to FIG. 9D is depicted as a rectangular shape for illustration purpose, however the disclosure is not limited thereto. In alternative embodiments, the top view of each of the system-on-integrated circuits SoIC may include a circular shape, an elliptical shape, a square shape, or a polygonal shape.

In one embodiment, at least some of the system-on-integrated circuits SoIC may include additional optical devices (e.g. modulators, grating coupler, edge coupler, filters or the combination thereof) located on the optical waveguide path OWP1/OWP2 depicted in FIG. 9A to FIG. 9D, the disclosure is not limited thereto. In some embodiments, the optical signal path at the exiting ports IOa and/or IOb may include various designs, such as different materials, tapered waveguide path or the like, to minimize optical loss in the optical couple of the system-on-integrated circuits SoIC. The disclosure is not limited thereto.

In some embodiments, one semiconductor chip SC of one system-on-integrated circuit SoIC processes first electric signals and transmits second electric signals (e.g. a feedback to the first electric signals) to one electric integrated circuit component EIC of the system-on-integrated circuit SoIC. The electric integrated circuit component EIC of the system-on-integrated circuit SoIC transmits the second electric signals to one photonic integrated circuit component PIC of the system-on-integrated circuit SoIC. The photonic integrated circuit component PIC of the system-on-integrated circuit SoIC receives and processes the second electric signals to convert the second electric signals into optical signals and transmits the optical signals to one photonic integrated circuit component PIC of another one system-on-integrated circuit SoIC. The photonic integrated circuit component PIC of the another one system-on-integrated circuit SoIC receives and processes the optical signals to convert the optical signals back into the second electric signals and transmits the second electric signals to one electric integrated circuit component EIC of the another one system-on-integrated circuit SoIC. The electric integrated circuit component EIC of the another one system-on-integrated circuit SoIC transmits the second electric signal to one semiconductor chip SC of the another one system-on-integrated circuit SoIC for processing. Due to such configuration, a loss of the electric signals can be reduced, and the time of signal transmission can be shortened. In other words, the system-on-integrated circuits SoIC are optically coupled and optically communicated to each other.

Figure 10:
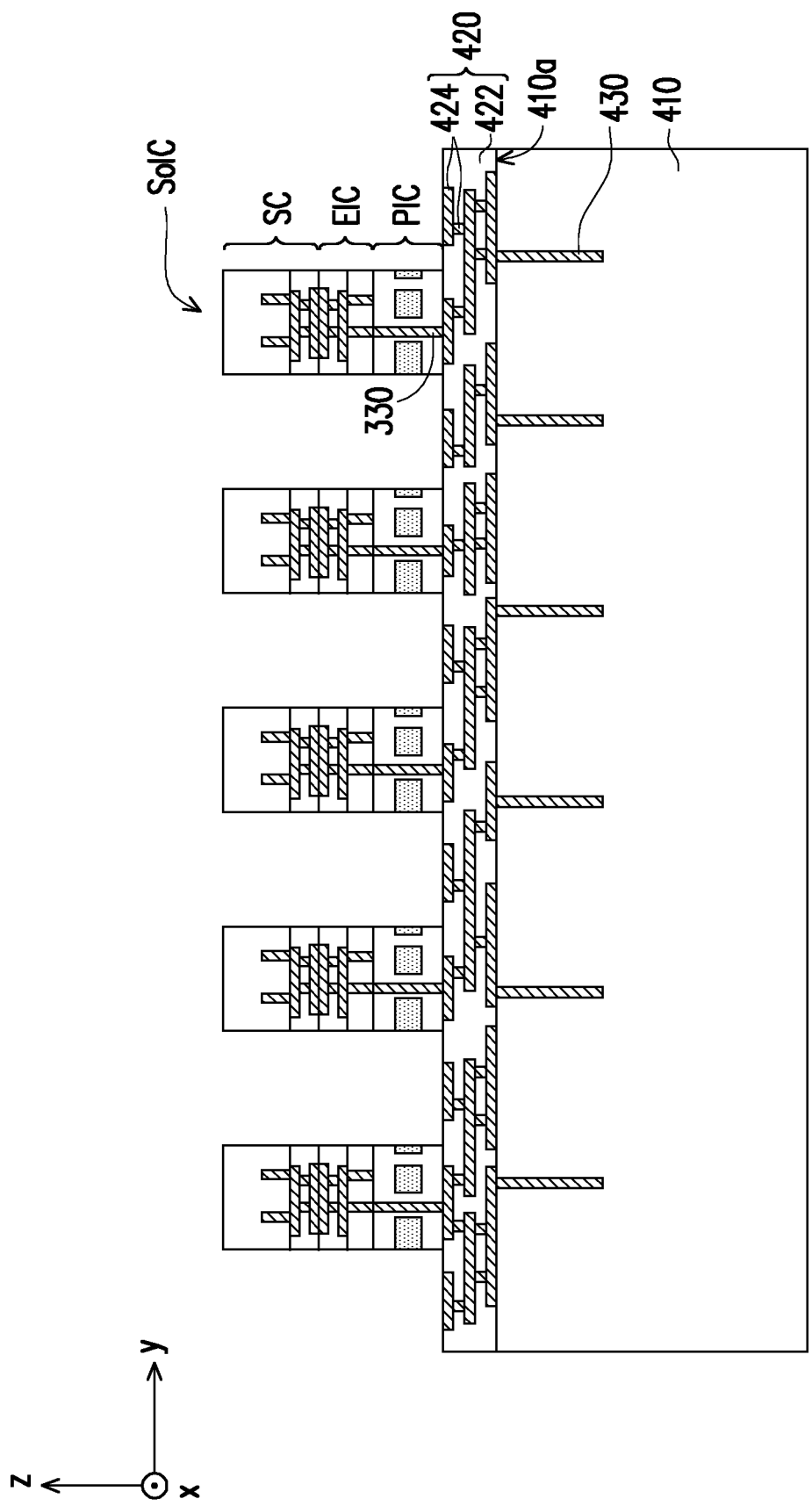

Referring to FIG. 10, in some embodiments, a semiconductor substrate 410 with an interconnection structure 420 and through silicon vias (TSVs) 430 are provided, in accordance with step S10 of FIG. 23. In certain embodiments, the semiconductor substrate 410 has an active surface 410a, where the interconnection structure 420 is disposed on the active surface 410a, and through silicon vias (TSVs) 430 are embedded in the semiconductor substrate 410 and electrically connected to the interconnection structure 420. The material and formation of the semiconductor substrate 410 may be the same or similar to the materials and formations of the semiconductor substrate 110 and/or the semiconductor substrate 210 described in FIG. 1, thus may not be repeated herein.

In some embodiments, the interconnection structure 420 is formed on the active surface 410a of the semiconductor substrate 410. In certain embodiments, the interconnection structure 420 may include one or more inter-dielectric layers 422 and one or more patterned conductive layers 424 stacked alternately. The numbers of the layers of the inter-dielectric layers 422 and the patterned conductive layers 424 may be less than or more than what is depicted in FIG. 10, and may be designated based on the demand and/or design layout; the disclosure is not specifically limited thereto. For example, as shown in FIG. 10, a top surface of a topmost layer of the patterned conductive layers 424 is accessibly revealed by a topmost layer of the inter-dielectric layers 422. There is a high degree of coplanarity between the top surfaces of the topmost layer of the patterned conductive layers 424 and the topmost layer of the inter-dielectric layers 422. The material and formation of the interconnection structure 430 may be the same or similar to the materials and formations of the interconnection structure 120 and/or the interconnection structure 220 described in FIG. 1, thus may not be repeated herein.

In some embodiments, the TSVs 430 are embedded in the semiconductor substrate 410, which extends from the active surface 410a into the semiconductor substrate 410. As shown in FIG. 10, for example, top surfaces of the TSVs 430 are exposed by and substantially leveled with the active surface 410a of the semiconductor substrate 410, so that the TSVs 430 are physically connected to a lowest layer of the patterned conductive layers 424 of the interconnection structure 420. The material and shape of the TSVs 430 may be the same or similar to the materials and shapes of the TSVs 130 and/or the TSVs 230 described in FIG. 1, thus may not be repeated herein.

Continued on FIG. 10, in certain embodiments, the system-on-integrated circuits SoIC are disposed on the semiconductor substrate 410, in accordance with step S20 of FIG. 23 (for example, involving steps S210~S235 of FIG. 24). In some embodiments, the system-on-integrated circuits SoIC may have the second dielectric layer 324 of the specific pattern depicted in FIG. 9A, the second dielectric layer 324 of the specific pattern depicted in FIG. 9B, the second dielectric layer 324 of the specific pattern depicted in FIG. 9C, or the second dielectric layer 324 of the specific pattern depicted in FIG. 9D. However, the disclosure is not limited thereto. In other embodiments, the system-on-integrated circuits SoIC may have the second dielectric layer 324 with at least two of the specific patterns depicted in FIG. 9A to FIG. 9D, such as the specific patterns depicted in FIGS. 9A and 9B, in FIGS. 9A and 9C, in FIGS. 9A and 9D, in FIGS. 9A, 9B and 9C, in FIGS. 9A, 9C and 9D, in FIGS. 9B, 9C and 9D, or in in FIGS. 9A, 9B, 9C and 9D. In some embodiments, as shown in FIG. 10, the system-on-integrated circuits SoIC including a stacking structure of the photonic integrated circuit component PIC, the electric integrated circuit component EIC and the semiconductor chip SC depicted in FIG. 8 are picked and placed on the semiconductor substrate 410, and are bonded to the semiconductor substrate 410.

The system-on-integrated circuits SoIC may be disposed on the semiconductor substrate 410 with the following steps, however the disclosure is not limited to the steps and the technical method implemented described herein. Although the steps of the manufacturing method are illustrated and described as a series of acts or events, it will be appreciated that the illustrated ordering of such acts or events are not to be interpreted in a limiting sense. In addition, not all illustrated process or steps are required to implement one or more embodiments of the disclosure, and additional process or steps may be used to implement one or more embodiments of the disclosure. For illustration purpose, only five system-on-integrated circuits SoIC are shown in FIG. 10 to FIG. 17, for example. However, the number of the system-on-integrated circuits SoIC may be more than five or less than five based on the demand and/or design layout, the disclosure is not limited thereto.

For example, as shown in FIG. 10, the system-on-integrated circuits SoIC are bonded to the semiconductor substrate 410 by hybrid bonding. That is, a hybrid bonding interface is between the system-on-integrated circuits SoIC and the semiconductor substrate 410. In some embodiments, the photonic integrated circuit components PIC are electrically connected to the interconnection structure 420 through physically connecting the conductive vias 330 and the topmost layer of the patterned conductive layers 424. In other words, the system-on-integrated circuits SoIC are electrically connected to the TSVs 430 embedded in the semiconductor substrate 410.

For example, the hybrid bonding process may include hydrophilic fusion bonding process or hydrophobic fusion bonding process. In one embodiment, a hydrophilic fusion bonding process is performed, where a workable bonding temperature approximately ranges from 200° C. to 400° C. and a workable bonding pressure is approximately greater than 1 J/m$^2$; however, the disclosure is not specifically limited thereto.

In certain embodiments, prior to placing the system-on-integrated circuits SoIC over the semiconductor substrate 410, a predetermined optical waveguide path having one or more bent portions and one or more non-bent portions is provided, in accordance with step S210 of FIG. 24. In some embodiments, the predetermined optical waveguide path is used for a layout of the system-on-integrated circuits SoIC (e.g. for determining the positioning location of the system-on-integrated circuits SoIC on the semiconductor substrate 410). For example, the predetermined optical waveguide path may include a virtual projection of the predetermined optical waveguide path projecting on the interconnection structure 420 disposed on the semiconductor substrate 410, however the disclosure is not limited thereto.

In certain embodiments, the system-on-integrated circuits SoIC are placed over the semiconductor substrate 410 based on the predetermined optical waveguide path, in accordance with step 220 of FIG. 24. In some embodiments, a first set of the system-on-integrated circuits SoIC are placed on the interconnection structure 420 of the semiconductor substrate 410 corresponding to locations of the one or more bent portions of the predetermined optical waveguide path, and the first set of the system-on-integrated circuits SoIC are the system-on-integrated circuits SoIC having the second dielectric layer 324 of the specific pattern depicted in FIG. 9A (or FIG. 9C), in accordance with step S222 of FIG. 24. In other embodiments, a second set of the system-on-integrated circuits SoIC may be optionally placed on the interconnection structure 420 of the semiconductor substrate 410 corresponding to locations of the one or more non-bent portions of the predetermined optical waveguide path, and the second set of the system-on-integrated circuits SoIC are the system-on-integrated circuits SoIC having the second dielectric layer 324 of the specific pattern depicted in FIG. 9B (or FIG. 9D), in accordance with the optional step S224 of FIG. 24. However, the disclosure is not limited thereto, the orders of step S222 and step S224 are interchangeable in the process described in FIG. 24. In an alternative embodiment, based on the demand and/or design layout, step S222 may be an optional step while step S224 is required.

In certain embodiments, after placing the system-on-integrated circuits SoIC over the semiconductor substrate 410 based on predetermined optical waveguide path, the system-on-integrated circuits SoIC are hybrid bonded to the semiconductor substrate 410, in accordance with step 230 of FIG. 24. For example, after the first set of the system-on-integrated circuits SoIC are placed on the semiconductor substrate 410 at the corresponding locations to the one or more bent portions of the predetermined optical waveguide path, the first set of the system-on-integrated circuits SoIC are hybrid bonded to the semiconductor substrate 410, according to step 232 of FIG. 24. In other embodiments where the optional step 224 takes place, the second set of the system-on-integrated circuits SoIC are placed on the semiconductor substrate 410 at the corresponding locations to the one or more non-bent portions of the predetermined optical waveguide path, the second set of the system-on-integrated circuits SoIC are then hybrid bonded to the semiconductor substrate 410, in accordance with the optional step 234 of FIG. 24. However, the disclosure is not limited thereto, the orders of step S232 and step S234 are interchangeable in the process described in FIG. 24. In an alternative embodiment, based on the demand and/or design layout, step S232 may be an optional step while step S244 is required.

For example, in step 230 of FIG. 24, the first set of the system-on-integrated circuits SoIC and the second set of the system-on-integrated circuits SoIC may be hybrid bonded to the semiconductor substrate 410 in different hybrid bonding processes (e.g. step S232 and step 234); and with such manner, an optical measurement may simultaneously take place to ensure the positioning configurations of the system-on-integrated circuits SoIC being matching the predetermined optical waveguide path for achieving high efficiency optical coupling between the system-on-integrated circuits SoIC disposed on the semiconductor substrate 410. However, in an alternative embodiment, the first set of the system-on-integrated circuits SoIC and the second set of the system-on-integrated circuits SoIC may be hybrid bonded to the semiconductor substrate 410 in one single hybrid bonding process. In addition, in some other embodiments, the number of sets of the system-on-integrated circuits SoIC may be more than two based on the design layout and demand, where the predetermined optical waveguide path having one or more bent portions and one or more non-bent portions may be mapped in multiple times during the optical inspection to obtain an acceptable optical coupling efficiency based on the demand; the disclosure is not limited thereto.

Figure 11:
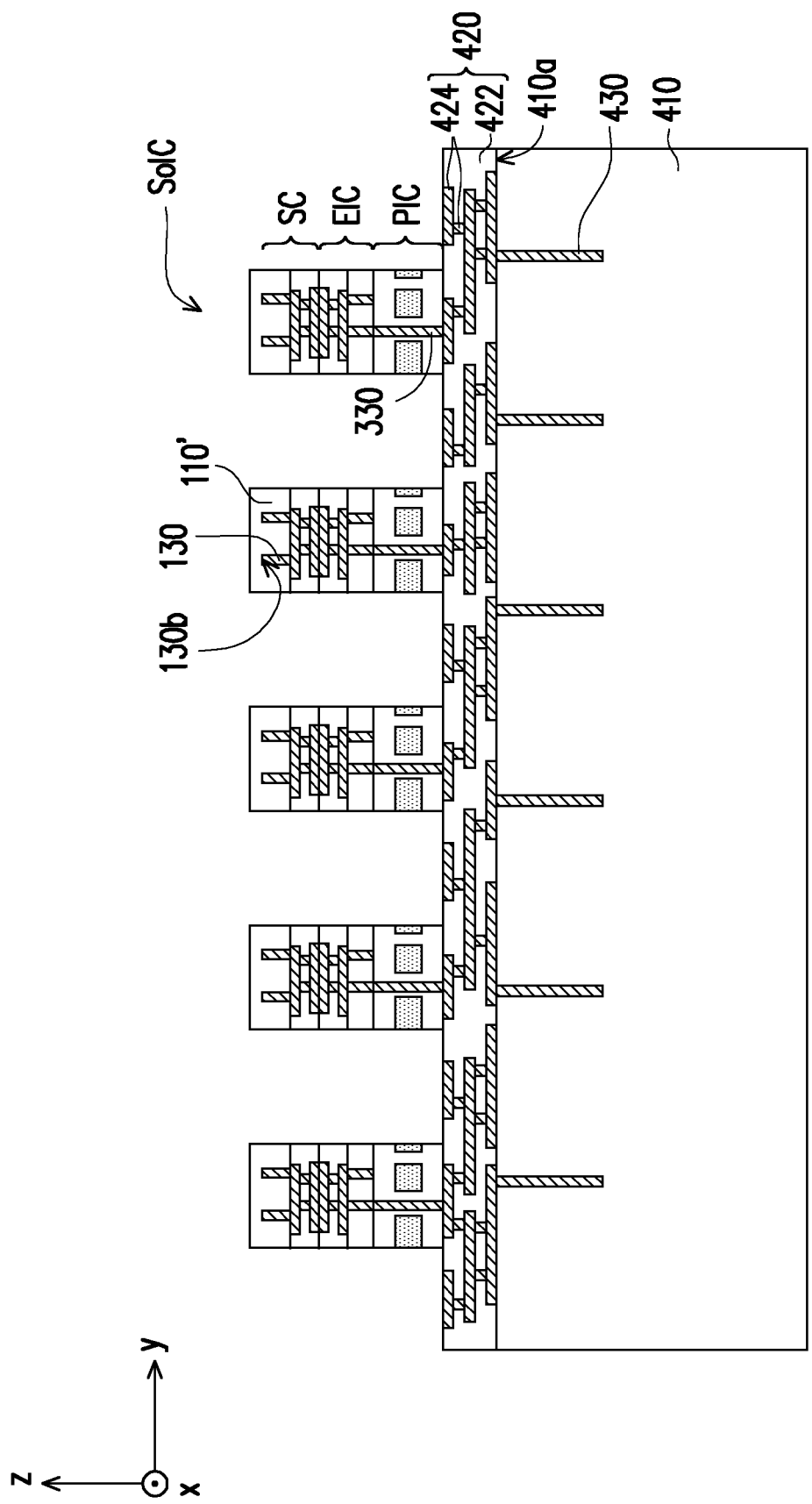

Referring to FIG. 11, in some embodiments, after disposing the system-on-integrated circuits SoIC on the semiconductor substrate 410, a pre-thinning step is performed on the system-on-integrated circuits SoIC to remove a portion of the semiconductor substrate 110', where the bottom surface 130b of the TSVs 130 are still embedded in the semiconductor substrate 110', as shown in FIG. 11. In some embodiments, the pre-thinning step may include a grinding process or a CMP process. After the pre-thinning step, a cleaning step may be optionally performed, for example to clean and remove the residue generated from the pre-thinning step.

Figure 12:
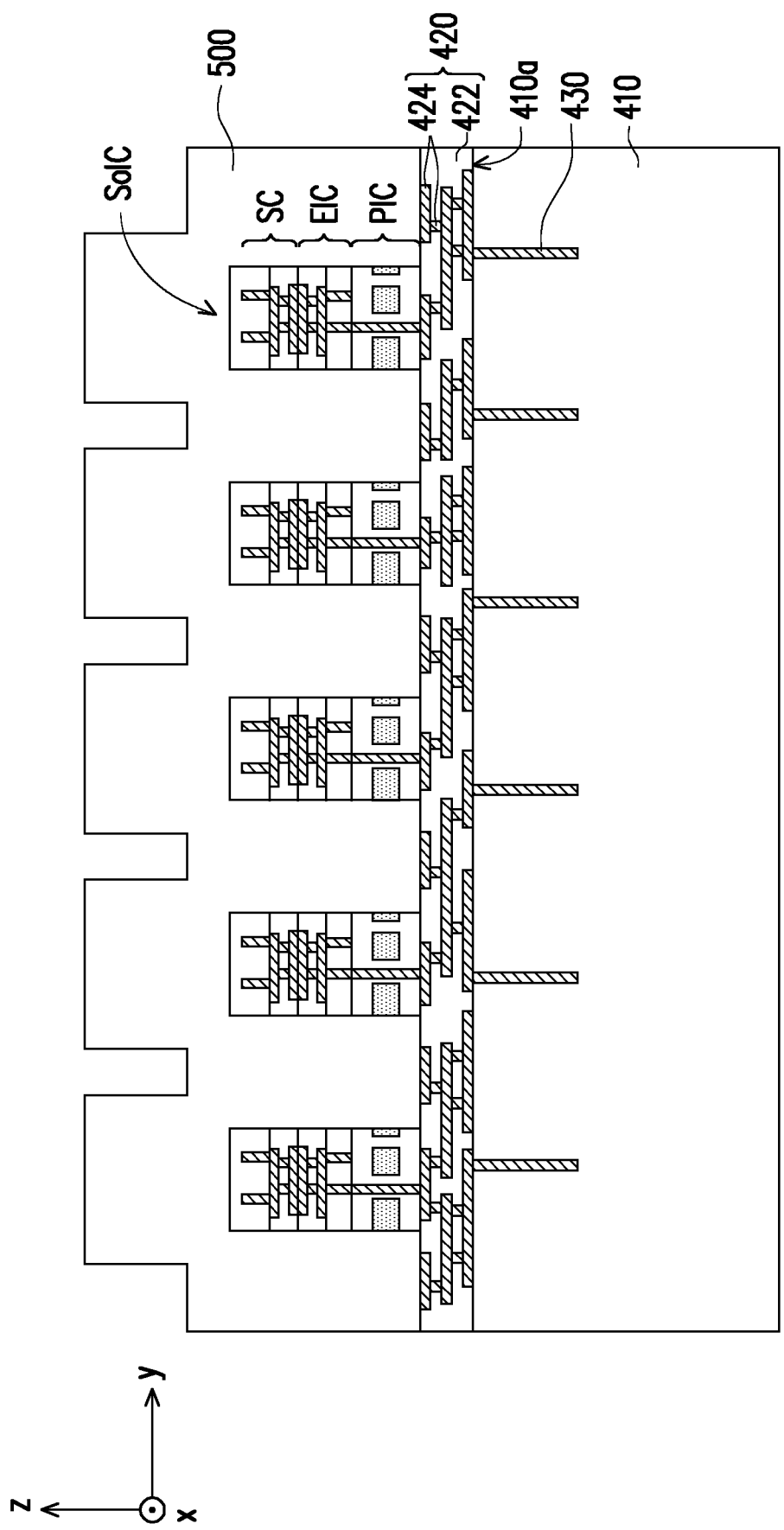

Referring to FIG. 12, in some embodiments, after the pre-thinning step, an insulating encapsulant 500 is conformally formed over the semiconductor substrate 410, according to step 30 of FIG. 23. As shown in FIG. 12, for example, the insulating encapsulant 500 encapsulates the system-on-integrated circuits SoIC and covers a portion of the interconnection structure 420 exposed by the system-on-integrated circuits SoIC. In some embodiments, the insulating encapsulant 500 is optically transparent to the optical signal to be processed by the system-on-integrated circuits SoIC, and may be an oxide (such as silicon oxide, silicon nitride, and/or tetraethoxysilane (TEOS)) or any suitable insulating materials for gap fill, and may be formed by deposition (such as a CVD process). The disclosure is not limited thereto. As shown in FIG. 12, the system-on-integrated circuits SoIC are covered by the insulating encapsulant 500.

Figure 13:
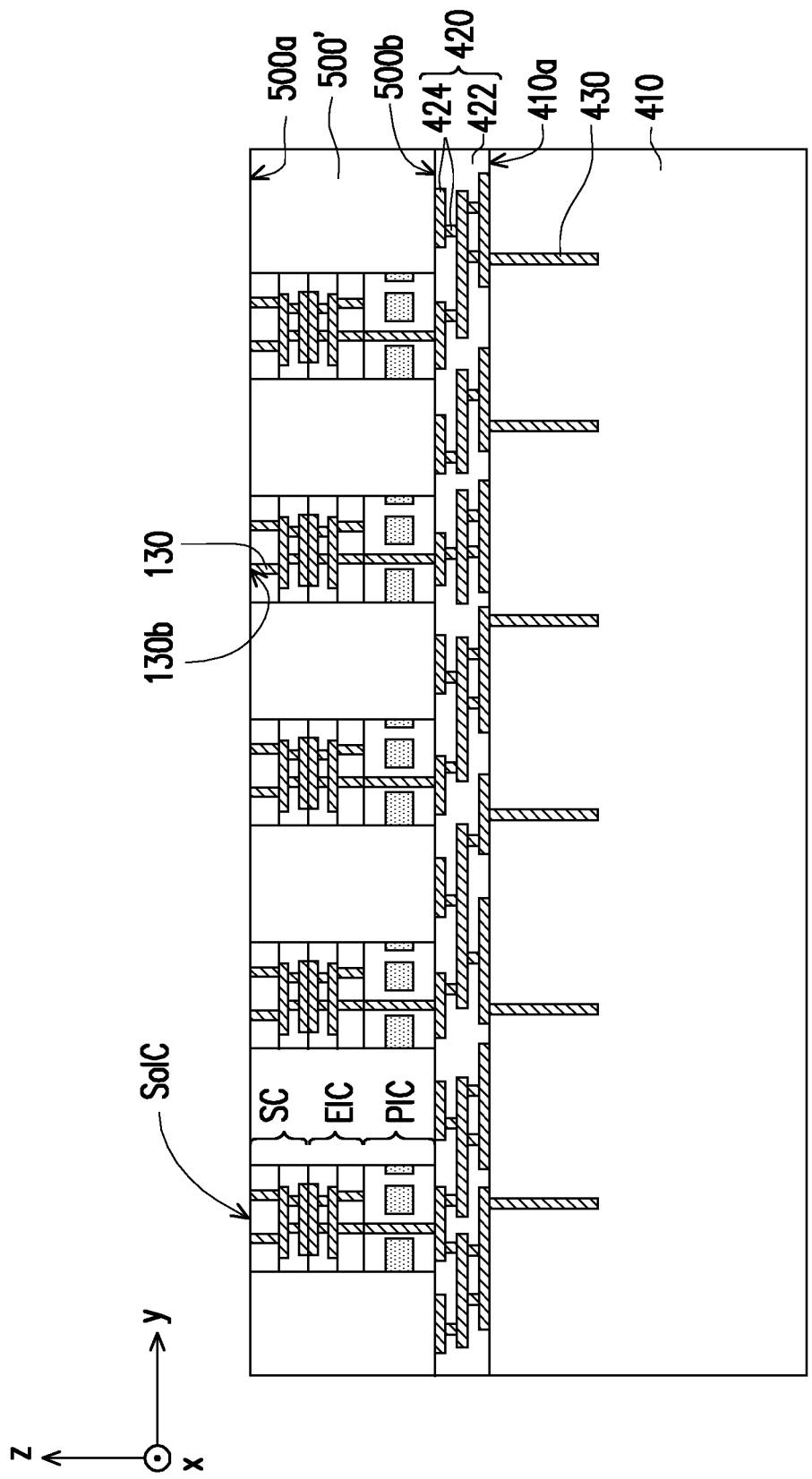

Referring to FIG. 13, in some embodiments, after the formation of the insulating encapsulant 500, a planarizing step is performed on the insulating encapsulant 500 to form an insulating encapsulant 500' exposing the bottom surfaces 130b of the TSVs 130 of the system-on-integrated-circuits SoIC. For example, a portion of the insulating encapsulant 500 is removed to form the insulating encapsulant 500' having a flat and planar surface, as shown in FIG. 13. That is, for example, after the planarizing step, the bottom surfaces 130b of the TSVs 130 is substantially leveled with and coplanar to a top surface 500a of the insulating encapsulant 500'. In some embodiments, the planarizing step may include a grinding process or a CMP process. After the planarizing step, a cleaning step may be optionally performed, for example to clean and remove the residue generated from the planarizing step.

Figure 14:
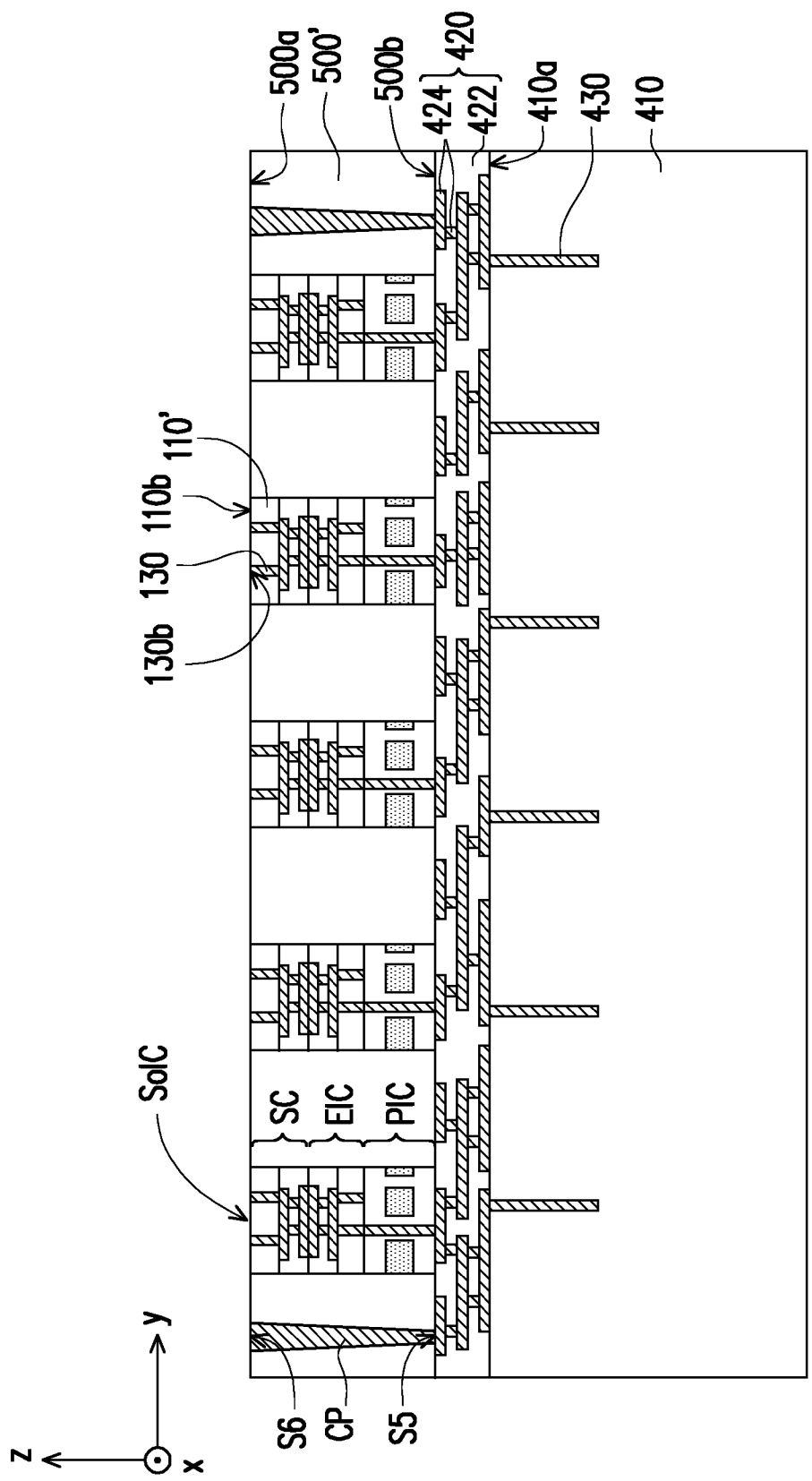

Referring to FIG. 14, in some embodiments, conductive pillars CP are formed in the insulating encapsulant 500', according to step S40 of FIG. 23. As shown in FIG. 14, for example, the conductive pillars CP are embedded in and penetrate through the insulating encapsulant 500', where bottom surfaces S5 of the conductive pillars CP are accessibly revealed by a bottom surface 500b of the insulating encapsulant 500' and physically connected to the topmost layer of the patterned conductive layers 424 of the interconnection structure 420, and top surfaces S6 of the conductive pillars CP are accessibly revealed by the top surface 500a of the insulating encapsulant 500'. In FIG. 14, only two conductive pillars CP are shown, however the disclosure is not limited thereto. The number of the conductive pillars CP may be one or more than one depending on the demand.

In some embodiments, the formation of the conductive pillars CP may include forming openings penetrating the insulating encapsulant 500' to expose portions of the topmost layer of the patterned conductive layers 424 of the interconnection structure 420, and forming conductive material (not shown) in the openings to form the conductive pillars CP connecting to the exposed portions of the topmost layer of the patterned conductive layers 424. The openings may be, for example, formed by a laser drilling process. The conductive material may be, for example, formed by filling and curing the conductive paste to form the conductive pillars CP, or formed by electroplating.

In one embodiment, after the formation of the conductive pillars CP, a planarizing step may be optionally performed so that the top surface 500a of the insulating encapsulant 500', the bottom surfaces 130b of the TSVs 130, the bottom surface 110b of the semiconductor substrate 110', and the top surfaces S6 of the conductive pillars CP are substantially leveled with and coplanar to each other, as shown in FIG. 14. In some embodiments, the planarizing step may include a grinding process or a CMP process. After the planarizing step, a cleaning step may be optionally performed, for example to clean and remove the residue generated from the planarizing step. Due to the high degree of coplanarity and flatness between the bottom surface 130b of the TSVs 130, the bottom surface 110b of the semiconductor substrate 110', the top surface 500a of the insulating encapsulant 500' and the top surfaces S6 of the conductive pillars CP, the later-formed layer(s) can be formed on a flat structure.

Figure 15:
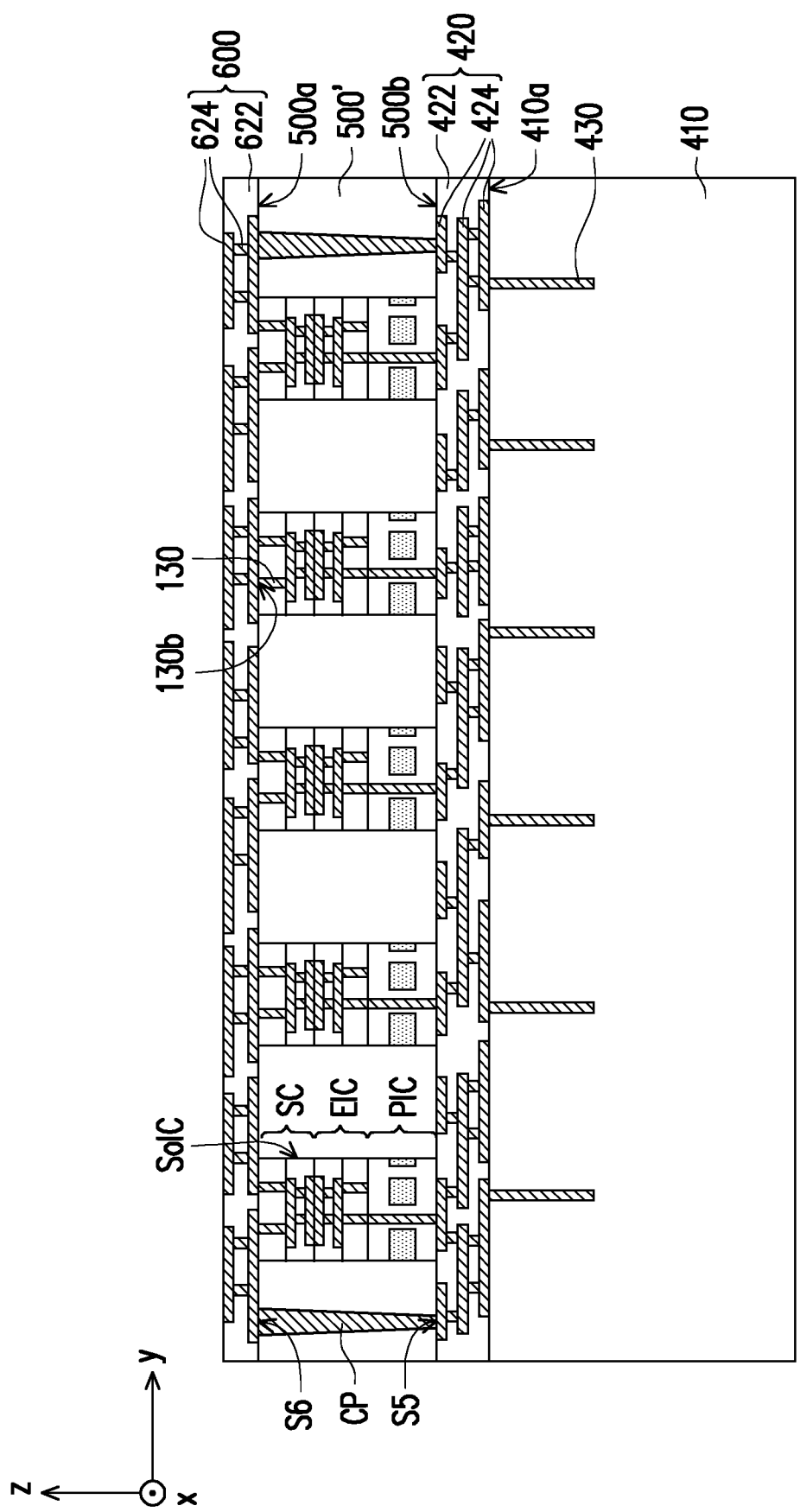

Referring to FIG. 15, in some embodiments, a redistribution circuit layer 600 is formed on the system-on-integrated-circuits SoIC, the insulating encapsulant 500' and the conductive pillars CP, according to step S50 of FIG. 23. In certain embodiments, the redistribution circuit layer 600 is fabricated to electrically connect with one or more connectors underneath. Here, the afore-said connectors may be the TSVs 130 and the conductive pillars CP, for example. In some embodiments, the redistribution circuit layer 600 is electrically connected to the TSVs 430 through the conductive pillars CP and the interconnection structure 420, and is electrically connected to the system-on-integrated-circuits SoIC through the TSVs 130. In one embodiment, through the redistribution circuit layer 600, the system-on-integrated-circuits SoIC may be electrically connected to each other, such that the system-on-integrated-circuits SoIC further communicate to one another through the presence of the redistribution circuit layer 600. That is, the system-on-integrated-circuits SoIC may not only optically communicated to one another but also communicate to one another through the presences of the interconnection structure 420 and/or the redistribution circuit layer 600. In a further alternative embodiment, the system-on-integrated-circuits SoIC may not be electrically connected to each other but only optically communicated to one another, the disclosure is not limited thereto.

In certain embodiments, the redistribution circuit layer 600 may include one or more inter-dielectric layers 622 and one or more patterned conductive layers 624 stacked alternately. In some embodiments, the patterned conductive layers 624 are sandwiched between the inter-dielectric layers 622, where a top surface of a topmost layer of the patterned conductive layers 624 is exposed by a topmost layer of the inter-dielectric layers 622 and physically connected to with one or more overlying connectors (e.g. later-formed conductive terminal(s) or semiconductor device(s) such as semiconductor active or passive device (s)), and a bottommost layer of the patterned conductive layers 624 exposed by a bottommost layer of the inter-dielectric layer 622 are electrically connected to with one or more underlying connectors (e.g. the TSVs 130 and the conductive pillars CP).

For example, the inter-dielectric layers 622 may be silicon oxide layers, silicon nitride layers, silicon oxy-nitride layers, or dielectric layers formed by other suitable dielectric materials, and the inter-dielectric layers 622 may be formed by deposition or the like. For example, the patterned conductive layers 624 may be patterned copper layers or other suitable patterned metal layers, and the patterned conductive layers 624 may be formed by electroplating or deposition. However, the disclosure is not limited thereto. In some embodiments, the patterned conductive layers 624 may be formed by dual-damascene method. The numbers of the layers of the inter-dielectric layers 622 and the patterned conductive layers 624 may be less than or more than what is depicted in FIG. 15, and may be designated based on the demand and/or design layout; the disclosure is not specifically limited thereto.

Figure 16:
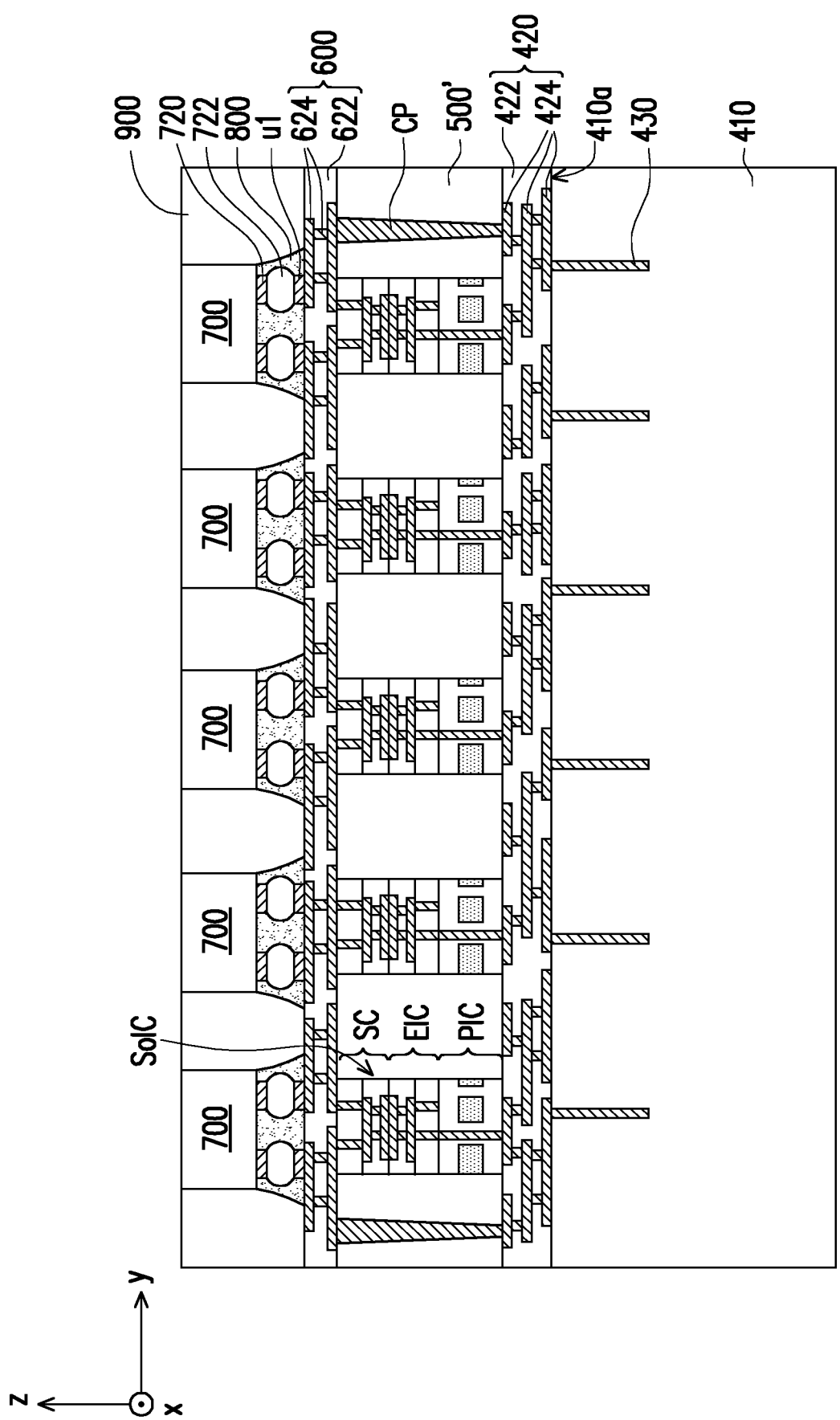

Referring to FIG. 16, in some embodiments, after the redistribution circuit layer 600 is formed, a plurality of under-bump metallurgy (UBM) patterns u1 are formed on the redistribution circuit layer 600 for electrically connecting with the conductive terminal(s) or semiconductor active or passive device(s). In certain embodiments, as shown in FIG. 16, the UBM patterns u1 are mechanically contacting the top surface of the topmost layer of the patterned conductive layers 624 exposed by the topmost layer of the inter-dielectric layers 622. In some embodiments, the material of the UBM patterns u1, for example, may include copper, nickel, titanium, tungsten, or alloys thereof or the like, and may be formed by an electroplating process. As shown in FIG. 16, only ten UBM patterns u1 are presented in FIG. 16 for illustrative purposes, however it should be noted that more than or less than ten UBM patterns u1 may be formed; the disclosure is not limited thereto.

Referring further to FIG. 16, in some embodiments, one or more than one semiconductor devices 700 are formed on the UBM patterns u1 disposed on the redistribution circuit layer 600. The numbers of the semiconductor devices 700 are not limited according to the disclosure, and may be selected based on the demand. In one embodiment, the semiconductor devices 700 may be semiconductor active device(s) and/or passive device(s). For example, the semiconductor devices 700 may be memory chip or memory chip stack. For example, the semiconductor devices 700 may include digital chips, analog chips or mixed signal chips, such as application-specific integrated circuit ("ASIC") chips, sensor chips, wireless and radio frequency (RF) chips, logic chips or voltage regulator chips, the disclosure is not limited thereto. For example, the semiconductor devices 700 may be passive devices of surface mount device type. In one embodiment, the semiconductor devices 700 may be the same type. However, in an alternative embodiment, the semiconductor devices 700 may be different types.

In some embodiments, the semiconductor devices 700 may be mounted on the UBM patterns u1 through a solder flux (or soldering process). As shown in FIG. 16, for example, connecting pads 720 of the semiconductor devices 700 are mounted on the UBM patterns u1 through connectors 722, so as to electrically connect the semiconductor devices 700 and the redistribution circuit layer 600. In some embodiments, through the redistribution circuit layer 600 and the UBM patterns u1, the semiconductor devices 700 are electrically connected to the system-on-integrated-circuits SoIC. In some embodiments, through the redistribution circuit layer 600 and the UBM patterns u1, the semiconductor devices 700 is electrically connected to the conductive pillars CP. In some embodiments, through the redistribution circuit layer 600, the UBM patterns u1 and the conductive pillars CP, the semiconductor devices 700 are electrically connected to the interconnection structure 420 and the TSVs 430. However, the disclosure is not limited thereto; in an alternative embodiment, the semiconductor devices 700 may be mounted on the redistribution circuit layer 600 by hybrid bonding.

As shown in FIG. 16, in some embodiments, an underfill material 800 is formed between the semiconductor devices 700 and the redistribution circuit layer 600 and dispensed around the connectors 722. In some embodiments, the underfill material 800 at least fills the gaps between the connectors 722 and between the redistribution circuit layer 600, the connectors 722 and the semiconductor devices 700. As shown in FIG. 16, for example, the underfill material 800 is disposed on the redistribution circuit layer 600 and wraps sidewalls of the connectors 722 to provide structural support and protection to the connectors 722.

In one embodiment, the underfill material 800 may further partially cover the sidewalls of the semiconductor devices 700 and exposes the top surfaces of the semiconductor devices 700. In an alternative embodiment, the underfill material 800 may completely cover the sidewalls and top surfaces of the devices 700. In an alternative embodiment, the underfill material 800 may completely cover the sidewalls of the semiconductor devices 700 and expose the top surfaces of the semiconductor devices 700. The disclosure is not limited thereto. In one embodiment, the underfill material 800 may be formed by underfill dispensing or any other suitable method. In some embodiments, the underfill material 800 may be a molding compound including polymer material (e.g., epoxy, resin, and the like) either with or without hardeners, fillers (e.g., silica filler, glass filler, aluminum oxide, silicon oxide, and the like), adhesion promoters, combinations thereof, and the like.

Referring to FIG. 16, in some embodiments, an insulating encapsulant 900 is formed over the redistribution circuit layer 600 for encapsulating the semiconductor devices 700. In some embodiments, the insulating encapsulant 900 covers the sidewalls of the semiconductor devices 700 and the underfill material 800. In some embodiments, as shown in FIG. 16, the insulating encapsulant 900 wraps the sidewalls of the semiconductor devices 700 and exposes the top surfaces of the semiconductor devices 700, however the disclosure is not limited thereto. In an alternative embodiment, the insulating encapsulant 900 wraps the sidewalls and top surfaces of the semiconductor devices 700. In one embodiment, the materials of the insulating encapsulant 900 and the underfill material 800 may be the same. In an alternative embodiment, the material of the insulating encapsulant 900 may be different from the material of the underfill material 800. In one embodiment, the insulating encapsulant 900 may be formed by an over-molding process followed by a grinding process. A cleaning process may be optionally performed after the grinding process, in addition. The disclosure is not limited thereto.

Figure 17:
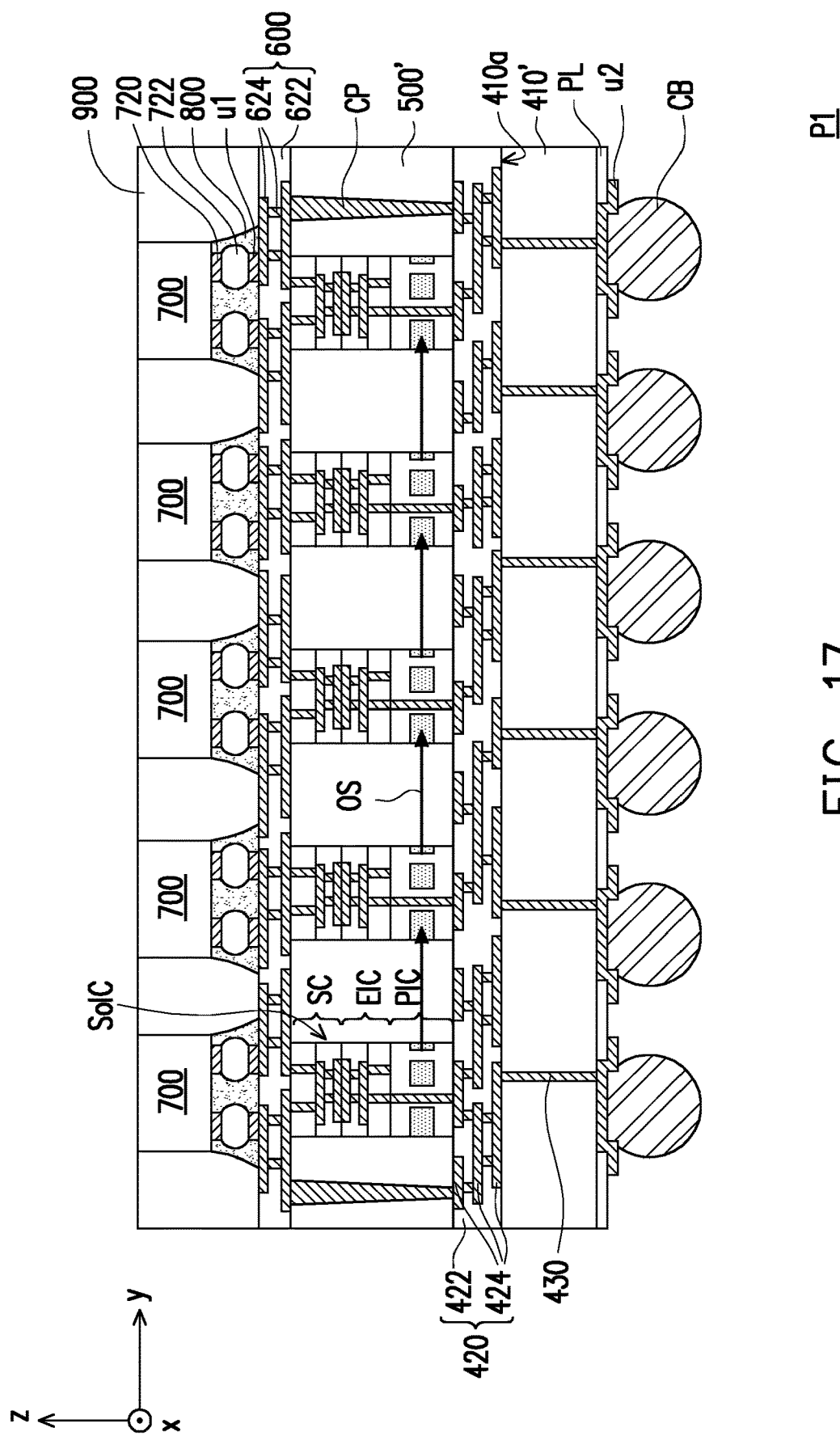
Figure 18:
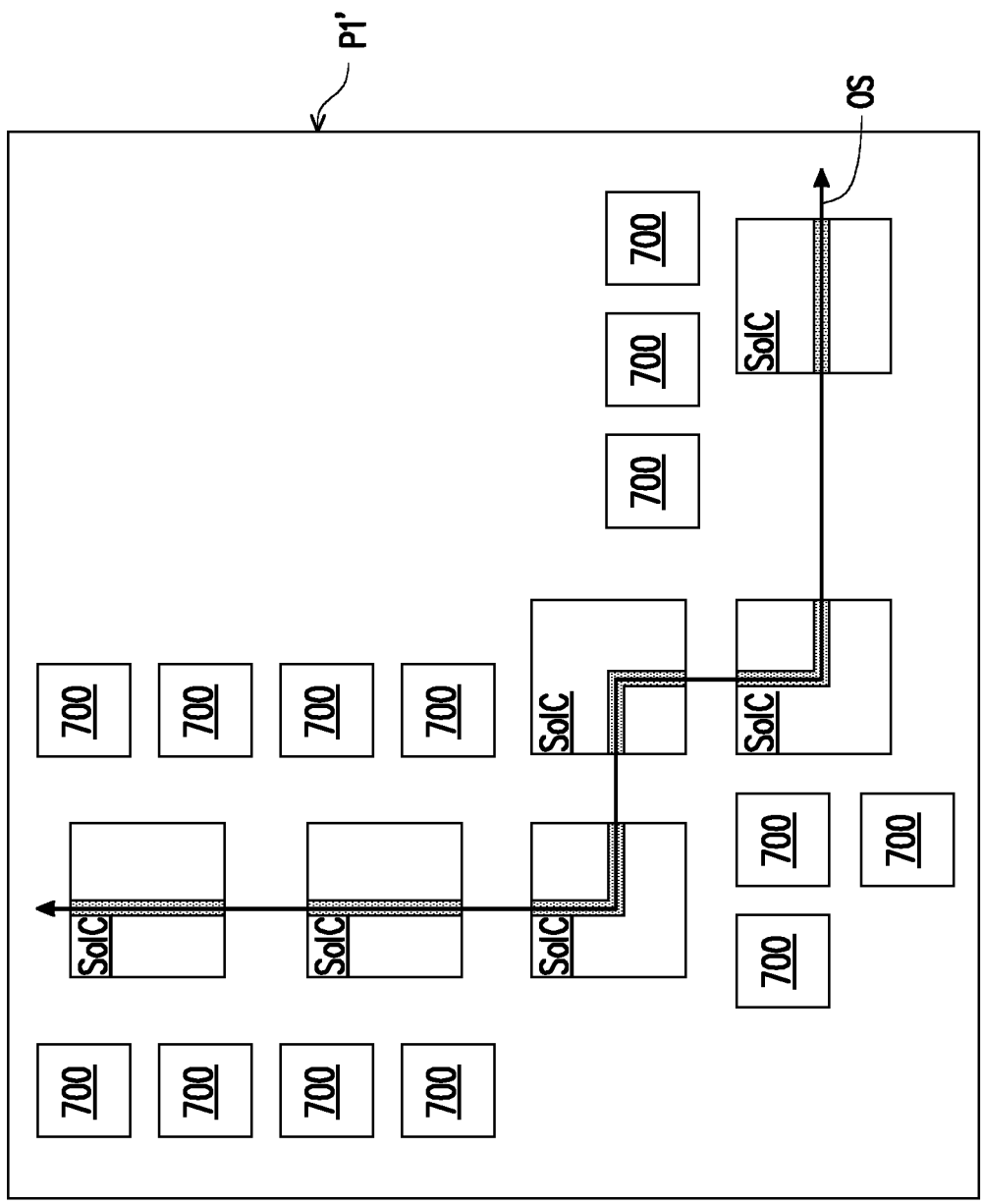
FIG. 18 is a top view of relative positions of system-on-integrated circuits and semiconductor devices included in a package structure in accordance with some embodiments of the disclosure.

Referring to FIG. 17, in some embodiments, a planarizing step is performed to expose the TSVs 430. In some embodiments, the semiconductor substrate 410 is planarized to form a semiconductor substrate 410' exposing the TSVs 430. In other words, the TSVs 430 are accessibly revealed by the semiconductor substrate 410'. In some embodiments, the planarizing step may include a grinding process or a CMP process; however, the disclosure is not limited thereto. After the planarizing step, a cleaning step may be optionally performed, for example to clean and remove the residue generated from the planarizing step.

In some embodiments, a patterned protection layer PL is formed on the semiconductor substrate 410', where the patterned protection layer PL exposes the TSVs 430 accessibly revealed by the semiconductor substrate 410'. The patterned portion layer PL may be formed by forming a blanket layer of a dielectric material over a surface of the semiconductor substrate 410' exposing the TSVs 430 and patterning the blanket dielectric material layer to form the patterned portion layer PL with openings exposing the TSVs 430. The blanket dielectric material layer may be, for example, formed by deposition. The pattering process may, for example, include photolithography and etching processes.

In some embodiments, a plurality of UBM patterns u2 are formed on the TSVs 430 exposed by the patterned protection layer PL for electrically connecting with conductive elements (e.g. conductive balls) and/or semiconductor elements (e.g., passive components or active components). In some embodiments, the UBM patterns u2 further cover portions of the patterned protection layer PL. As shown in FIG. 17, for example, the TSVs 430 exposed by the patterned protection layer PL physically and electrically connected to the UBM patterns u2 for assisting ball mounting. In some embodiments, the material of the UBM patterns u2, for example, may include copper, nickel, titanium, tungsten, or alloys thereof or the like, and may be formed by an electroplating process, for example. As shown in FIG. 17, only six UBM patterns u2 are presented in FIG. 17 for illustrative purposes, however, it should be noted that less than or more than six UBM patterns u2 may be formed based on the demand; the disclosure is not limited thereto.

Continued on FIG. 17, in some embodiments, conductive elements CB are formed over the redistribution circuit layer 600 and on the interconnection structure 420, according to step S60 of FIG. 23. In some embodiments, as shown in FIG. 17, the conductive elements CB are electrically connected to the TSVs 430 through the UBM patterns u2. That is, the UBM patterns u2 are located between the TSVs 430 and the conductive elements CB, respectively. In some embodiments, some of the conductive elements CB are electrically connected to the semiconductor devices 700 through some of the UBM patterns u2, the TSVs 430, the interconnection structure 420, the conductive pillars CP, the redistribution circuit layer 600 and the UBM patterns u1. In some embodiments, some of the conductive elements CB are electrically connected to the system-on-integrated-circuits SoIC through some of the UBM patterns u2, the TSVs 430, and the interconnection structure 420. In some embodiments, the conductive elements CB are attached to the UBM patterns u2 through a solder flux (or soldering process). In some embodiments, the conductive elements CB are, for example, solder balls or ball grid array (BGA) balls. In some embodiments, the conductive elements CB may be disposed on the UBM patterns u2 by ball placement process or reflow process.

In some embodiments, a dicing process is performed to cut a plurality of the package structure P1 connected to each other into individual and separated package structures P1. In one embodiment, the dicing process is a wafer dicing process including mechanical blade sawing or laser cutting. The manufacture of the package structure P1 is substantially completed after the dicing process.

In some embodiments, prior to the dicing process, a holding device (not shown) is adopted to secure the plurality of the package structures P1 connected to each other to avoid any damage during the dicing process. For example, the holding device may be an adhesive tape, a carrier film or a suction pad, the disclosure is not limited thereto.

As shown in FIG. 17, in certain embodiments, the system-on-integrated-circuits SoIC are arranged along the direction X and direction Y and are spaced apart from one another, where the system-on-integrated-circuits SoIC are optically coupled to one another to form an optical route for transmitting optical signal. Due to the configuration of the system-on-integrated-circuits SoIC, the optical signal OS can be transmitted among the system-on-integrated-circuits SoIC along the direction X and direction Y. Due to the second dielectric layer 324 in the system-on-integrated circuits SoIC (with the specific pattern depicted in FIG. 9A and/or the specific pattern depicted in FIG. 9B), various optical waveguide path for the package structure P1 can be easily achieved with low manufacturing cost. In some embodiments, as shown in FIG. 17, positioning locations of the semiconductor devices 700 are overlapped with positioning locations of the system-on-integrated-circuits SoIC in a vertical projection on the semiconductor substrate 410' (e.g. on the direction Z). However, the disclosure is not limited thereto; in an alternative embodiment, the positioning locations of the semiconductor devices 700 are aside of the positioning locations of the system-on-integrated-circuits SoIC in a vertical projection on the semiconductor substrate 410' (e.g. on the direction Z), as shown in FIG. 18.

Figure 19:
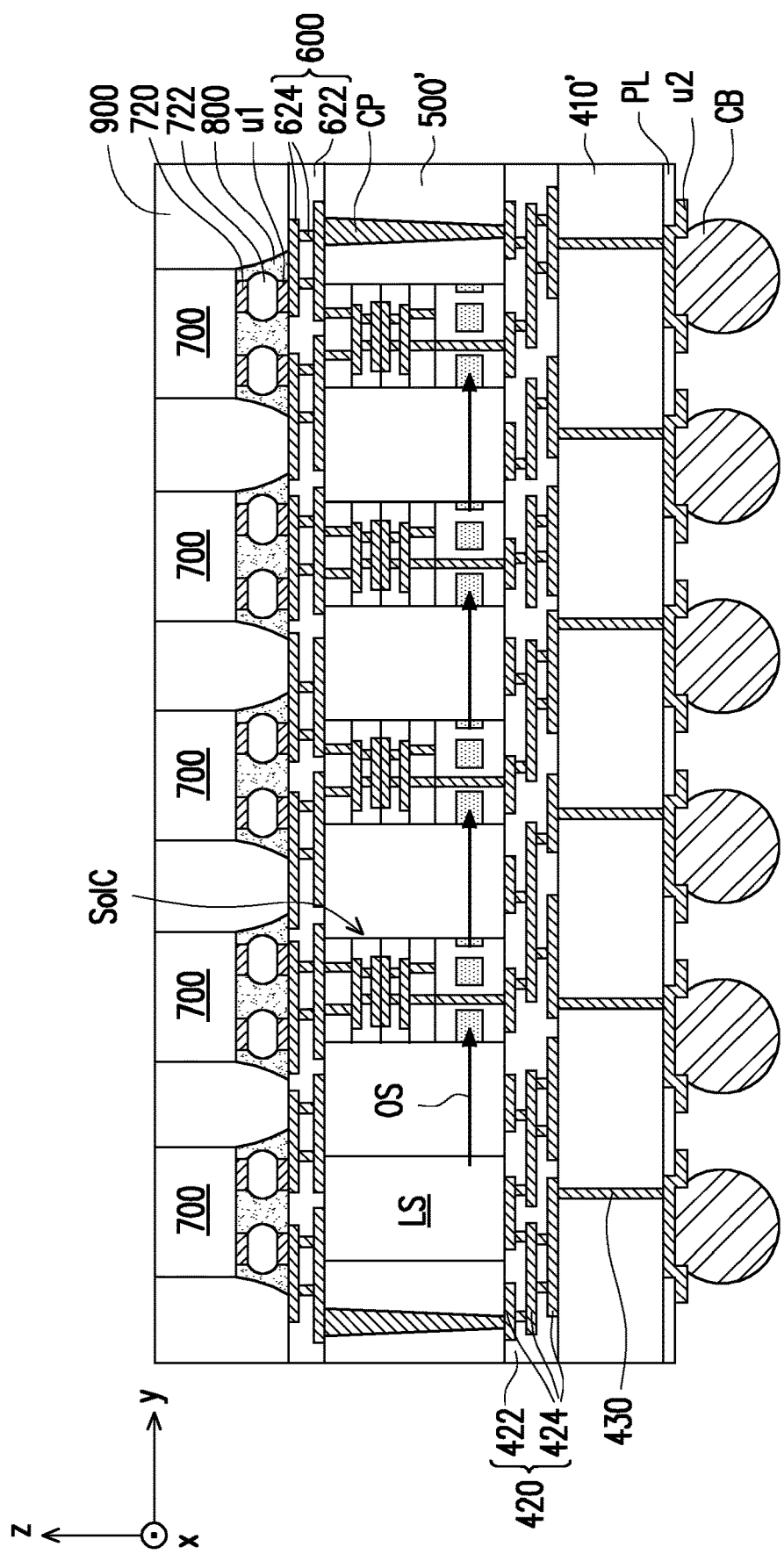
FIG. 19 is a schematic cross-sectional view of a package structure in accordance with some embodiments of the disclosure.

FIG. 19 is a schematic cross-sectional view of a package structure in accordance with some embodiments of the disclosure. Referring to FIG. 17 and FIG. 19 together, the package structure P1 depicted in FIG. 17 and the package structure P2 depicted in FIG. 19 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 17 and FIG. 19 together, the difference is that, for the package structure P2 depicted in FIG. 19, an additional element, e.g. a light source LS, is further included. As shown in FIG. 19, the light source LS is optically coupled to the system-on-integrated-circuits SoIC for providing an additional optical signal. In one embodiment, the light source LS may replace one of the system-on-integrated-circuits SoIC by taking the positioning location thereof (see FIG. 19). In some embodiments, the light source LS is encapsulated in the insulating encapsulant 500' and is electrically connected to the redistribution circuit layer 600 and the interconnection structure 420. However, the disclosure is not limited thereto, in an alternative embodiment (not shown), the light source LS may not replace any one of the system-on-integrated-circuits SoIC; and in fact, may be placed into the package structure P2 in addition to the system-on-integrated-circuits SoIC. The light source LS may be, for example, a laser die or the like.

Figure 20:
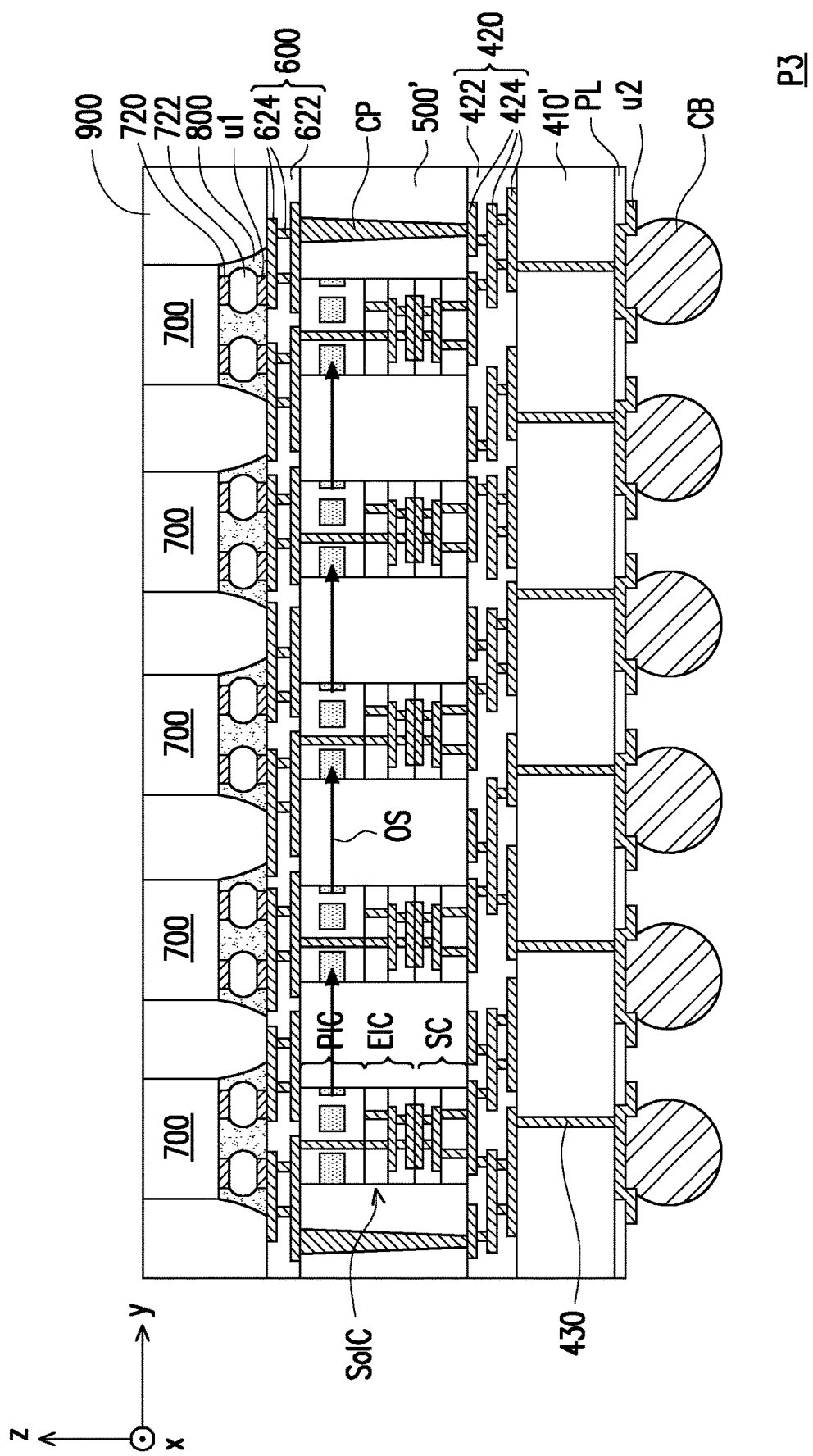
FIG. 20 is a schematic cross-sectional view of a package structure in accordance with some embodiments of the disclosure.

FIG. 20 is a schematic cross-sectional view of a package structure in accordance with some embodiments of the disclosure. Referring to FIG. 17 and FIG. 20 together, the package structure P1 depicted in FIG. 17 and the package structure P3 depicted in FIG. 20 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 17 and FIG. 20 together, the difference is that, for the package structure P3 depicted in FIG. 20, the system-on-integrated-circuits SoIC are flipped (turned upside down along the direction Z). For example, the orientations of the system-on-integrated-circuits SoIC are all flipped along the direction Z, and thus the system-on-integrated-circuits SoIC depicted in FIG. 20 are still optically coupled and communicated to one another. As shown in FIG. 20, in certain embodiments, the photonic integrated circuit component PIC of each of the system-on-integrated-circuits SoIC is physically connected to the bottommost layer of the patterned conductive layers 624 of the redistribution circuit layer 600, and the semiconductor chip SC of each of the system-on-integrated-circuits SoIC is physically connected to the topmost layer of the patterned conductive layers 424 of the interconnection structure 420.

Figure 21:
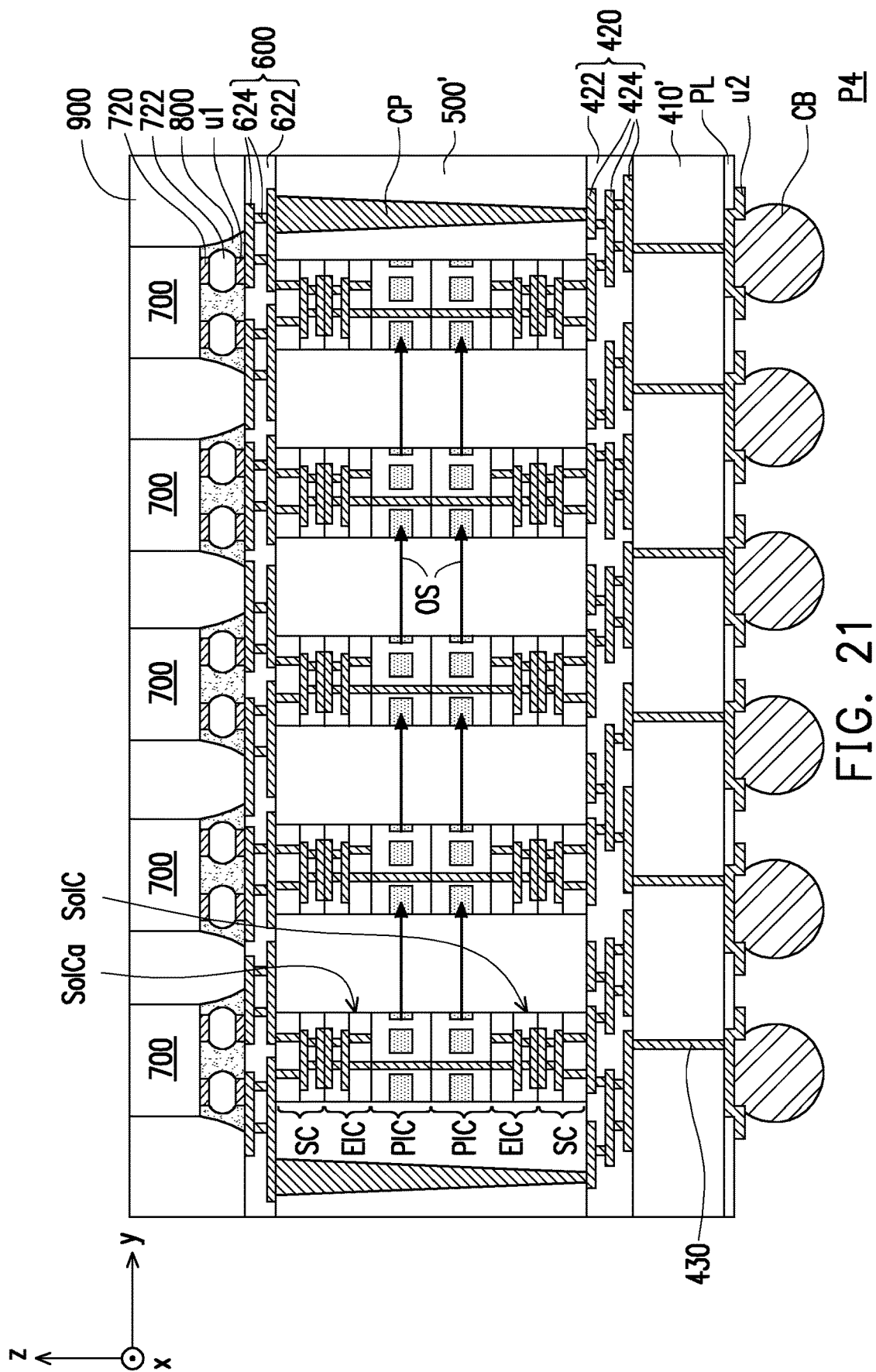
FIG. 21 is a schematic cross-sectional view of a package structure in accordance with some embodiments of the disclosure.

FIG. 21 is a schematic cross-sectional view of a package structure in accordance with some embodiments of the disclosure. Referring to FIG. 20 and FIG. 21 together, the package structure P3 depicted in FIG. 20 and the package structure P4 depicted in FIG. 21 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 20 and FIG. 21 together, the difference is that, for the package structure P4 depicted in FIG. 21, additional elements, e.g. one or more than one additional system-on-integrated-circuits SoICa, are further included. In some embodiments, each of the system-on-integrated-circuits SoICa are stacked on one of the system-on-integrated-circuits SoIC in the direction Z, where the system-on-integrated-circuits SoICa are substantially located at a same level (at the direction Z). Owing to such configuration, the system-on-integrated-circuits SoICa are optically coupled and communicated to each other while the system-on-integrated-circuits SoIC are optically coupled and communicated to each other, as shown in FIG. 21.

In some embodiments, the system-on-integrated-circuits SoICa may be electrically connected to the system-on-integrated-circuits SoIC, the system-on-integrated-circuits SoICa may be electrically connected to each other, and/or the system-on-integrated-circuits SoIC may be electrically connected to each other. For example, the system-on-integrated-circuits SoICa are electrically connected to the system-on-integrated-circuits SoIC by physically and electrically connecting the photonic integrated circuit components PIC of the system-on-integrated-circuits SoICa and the photonic integrated circuit components PIC of the system-on-integrated-circuits SoIC. As shown in FIG. 21, for example, the semiconductor chips SC of the system-on-integrated-circuits SoICa are physically and electrically connected to the redistribution circuit layer 600, and the semiconductor chips SC of the system-on-integrated-circuits SoIC are physically and electrically connected to the interconnection structure 420. In some embodiments, the system-on-integrated-circuits SoIC are electrically connected to the redistribution circuit layer 600 through the system-on-integrated-circuits SoICa and/or through the interconnection structure 420 and the conductive pillars CP. In some embodiments, the system-on-integrated-circuits SoICa are electrically connected to the interconnection structure 420 through the system-on-integrated-circuits SoIC and/or through the redistribution circuit layer 600 and the conductive pillars CP. In one embodiment, the system-on-integrated-circuits SoIC and the system-on-integrated-circuits SoICa are the same, such as the patterns of the second dielectric layers 324 of the system-on-integrated-circuits SoIC and the system-on-integrated-circuits SoICa are the same. However, the disclosure is not limited thereto. In an alternative embodiment, the system-on-integrated-circuits SoIC are different from the system-on-integrated-circuits SoICa, such as the patterns of the second dielectric layers 324 of the system-on-integrated-circuits SoIC and the system-on-integrated-circuits SoICa are different. Due to the additional the system-on-integrated-circuits SoICa, more optical signal can be transmitted at a once, and the speed of signal transmission in the package structure P4 can be further shortened.

Figure 22:
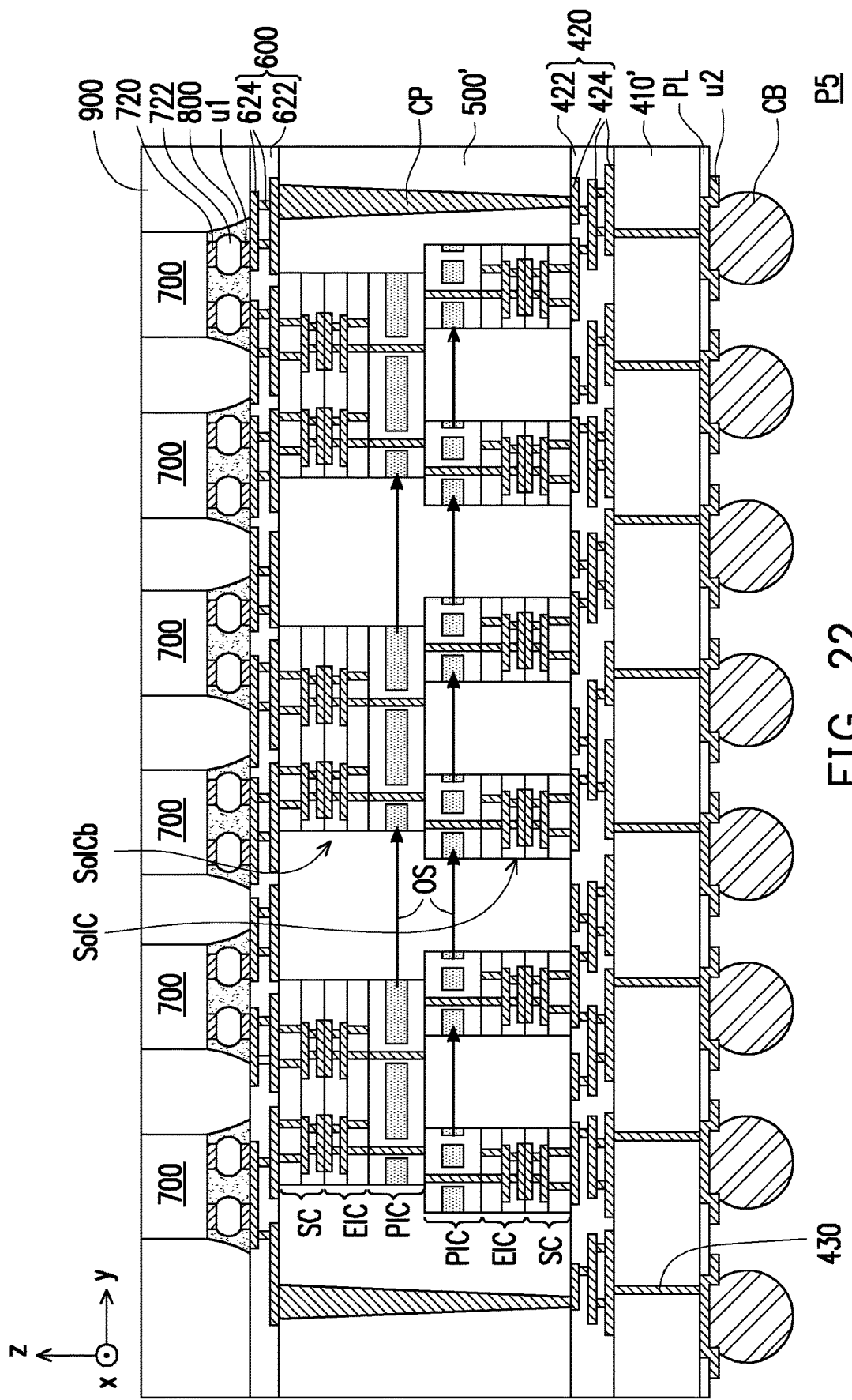
FIG. 22 is a schematic cross-sectional view of a package structure in accordance with some embodiments of the disclosure.

FIG. 22 is a schematic cross-sectional view of a package structure in accordance with some embodiments of the disclosure. Referring to FIG. 20 and FIG. 22 together, the package structure P3 depicted in FIG. 20 and the package structure P5 depicted in FIG. 22 are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 20 and FIG. 22 together, the difference is that, for the package structure P5 depicted in FIG. 22, additional elements, e.g. one or more than one additional system-on-integrated-circuits SoICb, are further included. In some embodiments, each of the system-on-integrated-circuits SoICb are stacked on more than one of the system-on-integrated-circuits SoIC in the direction Z, where the system-on-integrated-circuits SoICb are substantially located at a same level (at the direction Z). As shown in FIG. 22, the system-on-integrated-circuits SoICb are optically coupled and communicated to each other while the system-on-integrated-circuits SoIC are optically coupled and communicated to each other, in certain embodiments.

In some embodiments, the system-on-integrated-circuits SoICb may be electrically connected to the system-on-integrated-circuits SoIC, the system-on-integrated-circuits SoICb may be electrically connected to each other, and/or the system-on-integrated-circuits SoIC may be electrically connected to each other. As shown in FIG. 22, in certain embodiments, one of the system-on-integrated-circuits SoICb is electrically connected to two system-on-integrated-circuits SoIC by physically and electrically connecting the photonic integrated circuit component PIC of the one of the system-on-integrated-circuits SoICb and the photonic integrated circuit components PIC of the two system-on-integrated-circuits SoIC, where the semiconductor chip SC of the one of the system-on-integrated-circuits SoICb is physically and electrically connected to the redistribution circuit layer 600, and the semiconductor chips SC of the two system-on-integrated-circuits SoIC are physically and electrically connected to the interconnection structure 420. In some embodiments, the system-on-integrated-circuits SoIC are electrically connected to the redistribution circuit layer 600 through the respective one of the system-on-integrated-circuits SoICb and/or through the interconnection structure 420 and the conductive pillars CP. In some embodiments, the system-on-integrated-circuits SoICb are electrically connected to the interconnection structure 420 through the respective system-on-integrated-circuits SoIC and/or through the redistribution circuit layer 600 and the conductive pillars CP.

In addition, if considering the second dielectric layers 324 of the photonic integrated circuit components PIC of the two system-on-integrated-circuits SoIC are physically connected to the second dielectric layer 324 of the photonic integrated circuit components PIC of the one of the system-on-integrated-circuits SoICb, the optical signal can be further transmitted in direction Z (e.g. from the photonic integrated circuit components PIC of the one of the system-on-integrated-circuits SoICb to the corresponding two system-on-integrated-circuits SoIC or from the system-on-integrated-circuits SoIC to the corresponding one the system-on-integrated-circuits SoICb), for example. Due to the configuration of the system-on-integrated-circuits SoICb, the two system-on-integrated-circuits SoIC with one the system-on-integrated-circuits SoICb stacked thereon may electrically or optically communicate to each other. That is, the system-on-integrated-circuits SoICb serves as a bridge for a communication between the two system-on-integrated-circuits SoIC. However, the disclosure is not limited thereto. In other embodiments, each of the system-on-integrated-circuits SoICb may be stacked on more than two system-on-integrated-circuits SoIC in the direction Z.

In one embodiment, the system-on-integrated-circuits SoIC and the system-on-integrated-circuits SoICb are the same, such as the patterns of the second dielectric layers 324 of the system-on-integrated-circuits SoIC and the system-on-integrated-circuits SoICb are the same. However, the disclosure is not limited thereto. In an alternative embodiment, the system-on-integrated-circuits SoIC are different from the system-on-integrated-circuits SoICb, such as the patterns of the second dielectric layers 324 of the system-on-integrated-circuits SoIC and the system-on-integrated-circuits SoICb are different. Due to the additional the system-on-integrated-circuits SoICb, more optical signal can be transmitted at a once, and the speed of signal transmission in the package structure P5 can be further shortened.

In the disclosure, in the package structures P1~P5, the system-on-integrated-circuits SoIC (and/or SoICa, SoICb, if any) are optically coupled to one another. In addition, in some embodiments, the system-on-integrated-circuits SoIC (and/or SoICa, SoICb, if any) may be physically connected and thus electrically connected to each other, based on the design layout and the demand; however, the disclosure is not specifically limited thereto. The number of the system-on-integrated circuits SoIC (and/or SoICa, SoICb, if any) may be varied based on the demand and/or design layout, and is not limited to the disclosure. Due to the system-on-integrated-circuits SoIC, a loss of the electric signals for the package structures P1~P5 can be reduced, and the time of signal transmission in the package structures P1~P5 can be shortened. Furthermore, since the second dielectric layer 324 in the system-on-integrated circuits SoIC may be patterned to have the specific pattern depicted in FIG. 9A and/or the specific pattern depicted in FIG. 9B, various optical waveguide path for the package structures P1~P5 can be easily achieved with low manufacturing cost.

In accordance with some embodiments of the disclosure, a package structure includes a plurality of first dies and an insulating encapsulant. The plurality of first dies each include a first waveguide layer having a first waveguide path of a bent pattern, wherein the first waveguide layers of the plurality of first dies are optically coupled to each other to form an optical route. The insulating encapsulant encapsulates the plurality of first dies.

In accordance with some embodiments of the disclosure, a package structure includes a plurality of first dies, a plurality of second dies, and a redistribution circuit structure. The plurality of first dies each include a first waveguide layer having a first bent waveguide path, wherein the first waveguide layers of the plurality of first dies are optically coupled to each other. The plurality of second dies each include a second waveguide layer having a second straight waveguide path, wherein the second waveguide layers of the plurality of second dies are optically coupled to each other. The first waveguide layers of the plurality of first dies and the second waveguide layers of the plurality of second dies are optically coupled to form an optical route. The redistribution circuit structure is located on and electrically connects the plurality of first dies and the plurality of second dies.

In accordance with some embodiments of the disclosure, a manufacturing method of a package structure includes the following steps: providing a semiconductor substrate; forming a plurality of first dies and a plurality of second dies, each of the plurality of first dies comprising a first waveguide layer, and each of the plurality of second dies comprising a second waveguide layer; disposing the plurality of first dies and the plurality of second dies on the semiconductor substrate through hybrid bonding, the first waveguide layers of the plurality of first dies and the second waveguide layers of the plurality of second dies being optically coupled to each other to form an optical route; encapsulating the plurality of first dies and the plurality of second dies in an insulating material; forming a redistribution circuit structure on the insulating material, the redistribution circuit structure electrically connected to the plurality of first dies and the plurality of second dies; and forming conductive elements over the redistribution circuit structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
    a semiconductor substrate;
    a plurality of first dies, located on and electrically connected to the semiconductor substrate, and the plurality of first dies each having four edges and comprising a first waveguide layer having a first waveguide path of a bent pattern, wherein the first waveguide layers of the plurality of first dies are optically coupled to each other to form an optical route,
        wherein in each of the plurality of first dies, the bent pattern has a first exiting port located at one edge and a second exiting port located at another one edge, and extending directions of the one edge and the another one edge are intersected to each other, wherein other two edges are free from the bent pattern; and
    an insulating encapsulant, encapsulating the plurality of first dies and located on the semiconductor substrate, wherein a sidewall of the semiconductor substrate is aligned with a sidewall of the insulating encapsulant.

2. The package structure as claimed in claim 1, further comprising:
    a plurality of second dies, each comprising:
        a second waveguide layer having a second waveguide path of a straight pattern, wherein the second waveguide layers of the plurality of second dies are optically coupled to each other and optically coupled to the first waveguide layers of the plurality of first dies, and
    wherein the optical route is constituted by the first waveguide layers of the plurality of first dies and the second waveguide layers of the plurality of second dies.

3. The package structure as claimed in claim 2, wherein the plurality of second dies, each comprise:
    a photonic integrated circuit component; and
    an electric integrated circuit component disposed on and electrically connected to the photonic integrated circuit component,
    wherein in each of the plurality of second dies, a sidewall of the photonic integrated circuit component and a sidewall of the electric integrated circuit component are aligned along a stacking direction of the photonic integrated circuit component and the electric integrated circuit component, and the electric integrated circuit component and the photonic integrated circuit component are hybrid bonded.

4. The package structure as claimed in claim 2, further comprising a light source optical coupled to one of the first waveguide layer of at least one of the plurality of first dies and the second waveguide layer of at least one of the plurality of second dies, wherein the light source is encapsulated in the insulating encapsulant.

5. The package structure as claimed in claim 1, further comprising semiconductor chips, wherein each of the semiconductor chips is electrically connected to a respective one of the plurality of first dies.

6. The package structure as claimed in claim 5, further comprising memory devices encapsulating in the insulating encapsulant, wherein each of the memory devices is located on and electrically connected to a respective one of the semiconductor chips.

7. The package structure as claimed in claim 5, further comprising one or more than one memory device disposed on the insulating encapsulant, wherein the one or more than one memory device are electrically connected to one or more than one of the semiconductor chips, respectively.

8. A package structure, comprising:
    a plurality of first dies, each comprising a first waveguide layer having a bent waveguide path, wherein the first waveguide layers of the plurality of first dies are optically coupled to each other, wherein the bent waveguide path of each of the plurality of first dies has a first exiting port and a second exiting port respectively located at edges of a respective one of the plurality of the first dies, and extending directions of the edges are intersected to each other;
    a plurality of second dies, each comprising a second waveguide layer having a straight waveguide path, wherein the second waveguide layers of the plurality of second dies are optically coupled to each other, wherein the first waveguide layers of the plurality of first dies and the second waveguide layers of the plurality of second dies are optically coupled to form an optical route;
an insulating encapsulant, encapsulating the plurality of first dies and the plurality of second dies; and
a redistribution circuit structure, located on and in contact with a surface of the insulating encapsulant and electrically connecting the plurality of first dies and the plurality of second dies, wherein surfaces of the plurality of first dies or the plurality of second dies are coplanar with the surface of the insulating encapsulant.

9. The package structure as claimed in claim 8, wherein the insulating encapsulant is located between the semiconductor substrate and the redistribution circuit structure,
wherein the plurality of first dies and the plurality of second dies are laterally and vertically spaced apart from one another.

10. The package structure as claimed in claim 8, wherein the insulating encapsulant is located between the semiconductor substrate and the redistribution circuit structure,
wherein the plurality of first dies and the plurality of second dies are laterally spaced apart from one another, and
wherein at least one of the plurality of second dies is hybrid bonded to a respective one of the plurality of first dies along a stacking direction of the insulating encapsulant and the redistribution circuit structure.

11. The package structure as claimed in claim 10, wherein the at least one of the plurality of second dies is further hybrid bonded to another one of the plurality of first dies along the stacking direction of the insulating encapsulant and the redistribution circuit layer, and the at least one of the plurality of second dies is stacked on the two of the plurality of first dies hybrid bonded to the at least one of the plurality of second dies.

12. The package structure as claimed in claim 8, further comprising a light source optical coupled to one of the first waveguide layer of at least one of the plurality of first dies and the second waveguide layer of at least one of the plurality of second dies.

13. The package structure as claimed in claim 8,
wherein the plurality of first dies, each comprise:
a first photonic integrated circuit component each comprised with the first waveguide layer; and
a first electric integrated circuit component disposed on and electrically connected to the first photonic integrated circuit component,
wherein the first photonic integrated circuit component and the first electric integrated circuit component are hybrid bonded, and
wherein the plurality of second dies, each comprise:
a second photonic integrated circuit component each comprised with the second waveguide layer; and
a second electric integrated circuit component disposed on and electrically connected to the second photonic integrated circuit component,
wherein the second photonic integrated circuit component and the second electric integrated circuit component are hybrid bonded.

14. The package structure as claimed in claim 13, further comprising semiconductor chips, wherein the semiconductor chips are electrically connected to the first electric integrated circuit components and/or the second electric integrated circuit components.

15. The package structure as claimed in claim 14, further comprising memory devices, wherein each of the memory devices is electrically connected to a respective one of the semiconductor chips.

16. The package structure as claimed in claim 14, further comprising one or more than one memory device disposed on the redistribution circuit structure, wherein the one or more than one memory device are electrically connected to one or more than one of the semiconductor chips, respectively.

17. A manufacturing method of a package structure, comprising:
providing a semiconductor substrate;
forming a plurality of first dies and a plurality of second dies, each of the plurality of first dies comprising a first waveguide layer having a first waveguide path of a bent pattern, and each of the plurality of second dies comprising a second waveguide layer, wherein in each of the plurality of first dies, the bent pattern has a first exiting port located at one edge and a second exiting port located at another one edge, extending directions of the one edge and the another one edge are intersected to each other, and other two edges are free from the bent pattern;
disposing the plurality of first dies and the plurality of second dies on the semiconductor substrate through a hybrid bonding process, the first waveguide layers of the plurality of first dies and the second waveguide layers of the plurality of second dies being optically coupled to each other to form an optical route;
encapsulating the plurality of first dies and the plurality of second dies in an insulating material, and a sidewall of the semiconductor substrate being aligned with a sidewall of the insulating material;
forming a redistribution circuit structure on the insulating material, the redistribution circuit structure electrically connected to the plurality of first dies and the plurality of second dies; and
forming conductive elements over the redistribution circuit structure.

18. The manufacturing method as claimed in claim 17, wherein forming the plurality of first dies and the plurality of second dies comprises:
providing a first substrate with a circuit structure embedded therein;
hybrid bonding a second substrate with an optical waveguide structure embedded therein on the first substrate, the first substrate and the second substrate being coupled to each other; and
dicing the second substrate bonded to the first substrate into the plurality of first dies each comprising the first waveguide layer and the plurality of second dies each comprising the second waveguide layer, the plurality of first dies and the plurality of second dies individually being separated from one another,
wherein the first waveguide path of each of the first waveguide layers of the plurality of first dies is different from a second waveguide path of each of the second waveguide layers of the plurality of second dies, and the second waveguide path comprises a straight waveguide path.

19. The manufacturing method as claimed in claim 17, wherein disposing the plurality of first dies and the plurality of second dies on the semiconductor substrate comprises:
providing a predetermined optical waveguide path having one or more than one bent portion and one or more than one non-bent portion, the predetermined optical waveguide path being projected on a surface of the semiconductor substrate;

placing the plurality of first dies onto the surface of the semiconductor substrate corresponding to the one or more than one bent portion of the predetermined optical waveguide path, respectively;

placing the plurality of second dies onto the surface of the semiconductor substrate corresponding to the one or more than one non-bent portion of the predetermined optical waveguide path, respectively;

hybrid bonding the plurality of first dies on the semiconductor substrate; and hybrid bonding the plurality of second dies on the semiconductor substrate, wherein the optical route corresponds to the predetermined optical waveguide path.

20. The manufacturing method as claimed in claim 17, further comprising:

providing a light source;

disposing the light source on the semiconductor substrate to optically couple to one of the plurality of first dies and the plurality of second dies; and encapsulating the light source in the insulating material.

* * * * *